United States Patent [19]

Kawahara et al.

[11] Patent Number: 5,300,839
[45] Date of Patent: Apr. 5, 1994

[54] SEMICONDUCTOR IC DEVICE HAVING SENSE AMPLIFIER CIRCUIT

[75] Inventors: Takayuki Kawahara; Takesada Akiba, both of Kokubunji; Goro Kitsukawa, Tokyo; Yoshiki Kawajiri, Akishima; Kiyoo Itoh, Higashikurume; Takeshi Sakata, Kunitachi, all of Japan

[73] Assignees: Hitachi, Ltd., Tokyo; Hitachi Device Engineering Co., Ltd., Mobara, both of Japan

[21] Appl. No.: 865,852

[22] Filed: Apr. 9, 1992

[30] Foreign Application Priority Data

Apr. 15, 1991 [JP] Japan .................. 3-082228
Jan. 27, 1992 [JP] Japan .................. 4-011727

[51] Int. Cl.⁵ ............................................. G11C 7/06
[52] U.S. Cl. ................................. 307/530; 365/203
[58] Field of Search ............... 307/247.1, 350, 530; 365/189.06, 203, 205, 208

[56] References Cited

U.S. PATENT DOCUMENTS

| | | | |
|---|---|---|---|
| 4,604,534 | 8/1986 | Pricer | 365/203 |
| 4,802,130 | 1/1989 | Soneda | 365/205 |
| 4,943,944 | 7/1990 | Sakui et al. | 365/203 |
| 4,973,864 | 11/1990 | Nogami | 307/530 |
| 5,091,885 | 3/1992 | Ohsawa | 365/202 |

OTHER PUBLICATIONS

S. Suzuki et al.: "Threshold Difference Compensated Sense Amplifier", IEEE Journal of Solid-State Circuits, vol. SC-14, No. 6, Dec. 1979.

*Primary Examiner*—John Zazworsky
*Assistant Examiner*—Shawn Riley
*Attorney, Agent, or Firm*—Antonelli, Terry, Stout & Kraus

[57] ABSTRACT

A sense amplifier circuit is provided for sensing a very small signal includes two MOS transistors responsive to a differential voltage between first and second input signal lines to conduct a differential operation and switches respectively connected between drain regions and gate regions respectively of the two MOS transistors. Before the circuit senses and amplifies the signal, the switches are turned on to generate threshold voltages between the gate regions and the source regions respectively of the two transistors. Consequently, according to the variation in the threshold voltage between the respective transistors, a self-adjustment is achieved on bias voltages of the transistors before the signal amplification. The sense amplifier circuit resultantly develops its operation independent of the variation in the threshold voltage. One use for this sense amplifier circuit is to serve as a sense amplifier for a DRAM.

6 Claims, 15 Drawing Sheets

SEMICONDUCTOR IC DEVICE HAVING SENSE AMPLIFIER CIRCUIT

BACKGROUND OF THE INVENTION

The present invention is related to a semiconductor integrated circuit (IC) device having a sense amplifier circuit amplifying a very weak signal. In particular, the present invention relates to an improvement of the precision and increase in the operation speed of a semiconductor IC device associated with variations in characteristics between constituent elements thereof because the device is manufactured with a pattern of a fine structure leading to difficulty of dimension control in fabrication.

Heretofore, an example of a semiconductor memory device which includes sense amplifiers for amplifying very weak signals read from memory cells fabricated with a pattern of a fine lines has been described in a chapter "MOS Dynamic RAM (pp. 486–499)" of the "LSI Handbook", IEICE Japan, the Ohm-Sha Ltd. (1984).

Moreover, a DRAM including sense amplifier circuits constituted with CMOS transistors has been commonly used. FIG. 23 shows the constitution of such a DRAM. In this connection, a complementary signal marked with an over-line in the drawings will be represented as a signal preceded by a slant (/). Furthermore, unless otherwise specified, a signal designating a terminal name also indicates a wiring name and a line name, and in a case of a signal of a power source, a voltage value thereof is also designated.

The system of FIG. 23 includes a memory cell MC1, a word line W1, data lines D1 and /D1, a data line amplifier RA as a sense amplifier, signals PP and PN controlling the data line amplifier circuit RA, a precharge circuit PCC, and a signal PC controlling the precharge circuit PCC. MOS transistors M1 and M2 generate across output signal lines RO and /RO a signal current difference associated with a very-weak signal voltage difference developed between the data lines D1 and /D1. RM denotes a read switching circuit and YSR designates a signal controlling the read switching circuit RM. Moreover, WI and /WI are write signal lines, WM stands for a write switching circuit, and YSW indicates a signal controlling the write switching circuit WM.

In a read operation of the DRAM constructed as shown in FIG. 23, the input terminals D1 and /D1 of the data line amplifier circuit RA are precharged as shown in FIG. 24 by the precharge circuit PCC to a precharge potential of HVD, and then the PC is set to a lower level, thereby establishing a floating state of the data lines D1 and /D1.

Subsequently, when the word line W1 is set to a high level, a signal is read from the memory cell MC1 onto the data line D1. This slightly varies the potential of the data line D1. A difference between the potential of D1 and that of /D1 retained at HVD is sensed and is amplified by the data line amplifier RA.

SUMMARY OF THE INVENTION

On the other hand, the inventors of the present invention have recognized certain problems related to the known DRAM of FIG. 23, as follows discussed below.

Namely, although the input/output terminals D1 and /D1 of the data line amplifier RA are precharged to an identical precharge potential HVD, characteristics vary between the four MOS transistors constituting the amplifier RA.

In consequence, the inputs of the identical potential to the amplifier RA are not received as equivalently in-phase inputs (i.e. common-mode inputs) in some cases. Moreover, there may be developed an operation in which differential inputs are equivalently canceled out. In this case, the performance of the data line amplifier RA deteriorates considerably. That is, correlations between the signals inputted to the amplifier RA and the output signals amplified by the amplifier RA are quite different from those of ideal operations.

This is further emphasized when the pattern of the system configuration becomes to be finer and the variation of characteristics between the four MOS transistors is increased in the amplifier RA.

It is therefore an object of the present invention to provide a semiconductor IC in which the variation of characteristics between the transistors constituting the sense amplifier circuit does not substantially influence characteristics of the sense amplifier circuit.

In order to solve the problem, depending on the variation in characteristics of each sense amplifier, the precharge voltages of the input terminals of the sense amplifier are altered to compensate for the characteristics of the sense amplifier.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
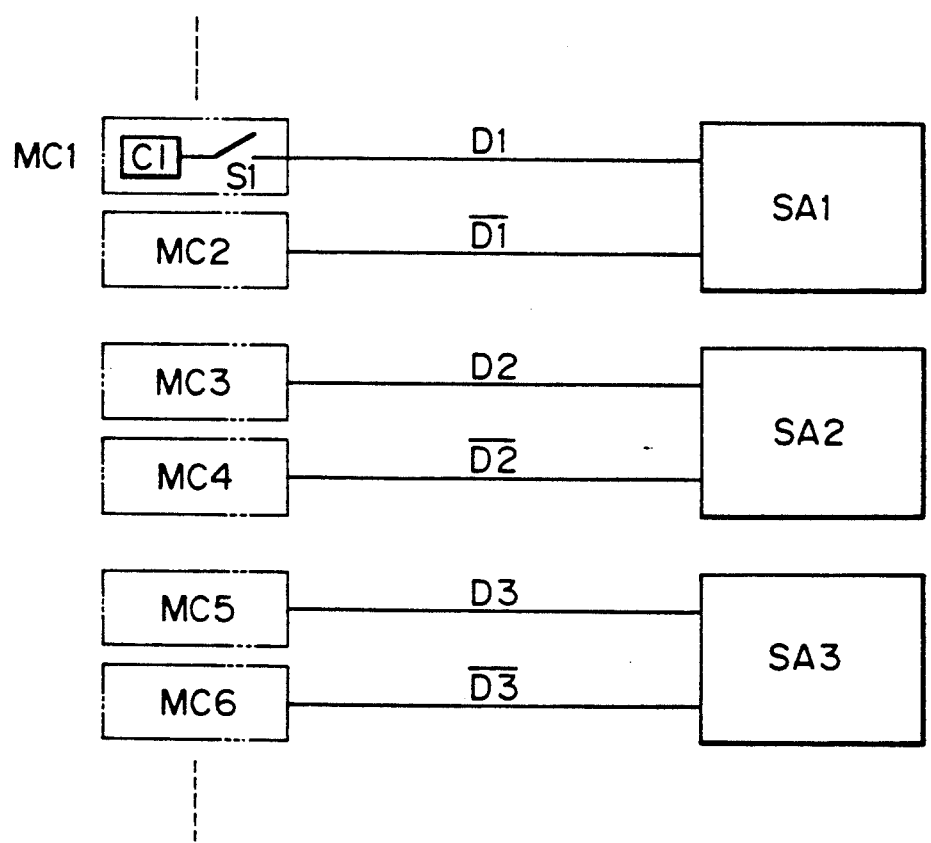
FIG. 1 is a diagram schematically showing the configuration of concept behind the present invention.

Referring now to the drawings, description will be given of embodiments according to the present invention.

FIG. 1 shows the conceptual structure of the present invention. The configuration includes sense amplifier circuits SA1 to SA3 for respectively amplifying very weak differential signals read from memory cells MC1 to MC6 and input/output terminals {D1,/D1} to {D3,/D3} respectively of the amplifiers SA1 to SA3. The memory cells MC1 to MC6 generate signals to be inputted to the sense amplifiers SA1 to SA3.

Each of the memory cells MC1 to MC6, for example, MC 1 is a DRAM cell constituted with a capacitor C1 storing therein input information and a switch S1.

Conventionally, the input/output terminals {D1,/D1} to {D3,/D3} are precharged in an initial operation to an identical potential and hence, in some cases, the input signals are not equivalently in-phase inputs due to variations in characteristics between transistors constituting the sense amplifiers SA1 to SA3.

Figure 2:
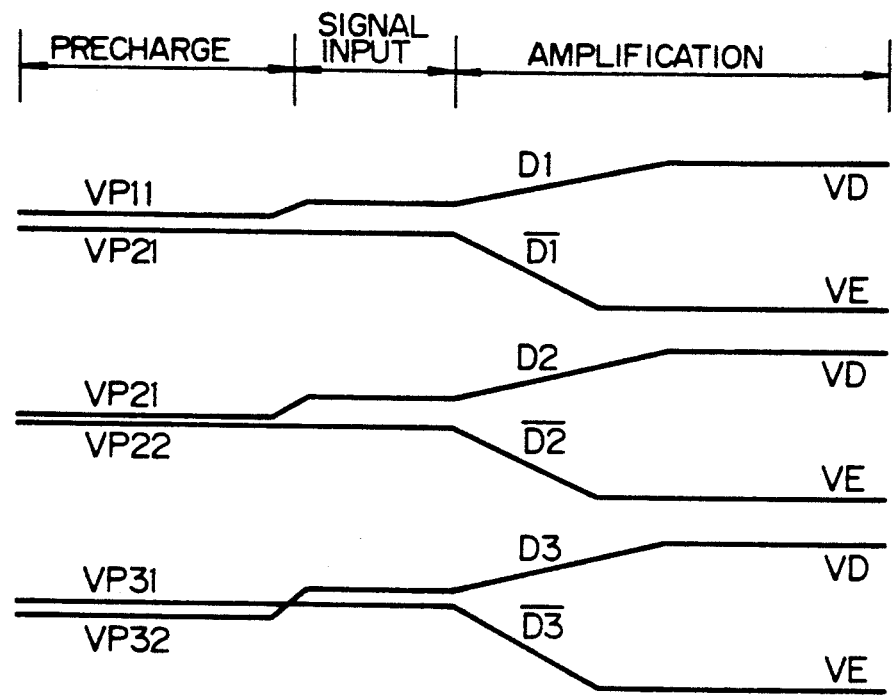
FIG. 2 is a schematic diagram showing the operation related to the concept according to the present invention.

To overcome the difficulty, according to this present invention, the precharge voltage is changed, as shown in FIG. 2, for the terminals depending on the characteristics of the amplifiers SA1 to SA3, thereby obtaining the equivalently in-phase inputs. Namely, in the sense amplifier SA1, the terminals D1 and /D1 are respectively precharged to potentials VP11 and VP12 to develop equivalently in-phase inputs. Similarly, in the sense amplifiers SA2 and SA3, the terminals D2 and /D2 and D3 and /D3 are respectively precharged to potentials VP21 and VP22 and VP31 and VP32 to respectively develop equivalently in-phase inputs. In general, these precharge voltages are mutually different from each other. As above, the mutually different precharge voltages are applied to the associated terminals of the sense amplifiers to respectively attain equivalently in-phase inputs, thereby improving the performance of the sense amplifiers.

In this regard, also in a case where input and output terminals are not shared, i.e., where the terminals are independently disposed as shown in the example of FIG. 1, the precharge voltage need only be altered for each input terminal to develop equivalently in-phase inputs in the sense amplifier circuits.

Figure 3:
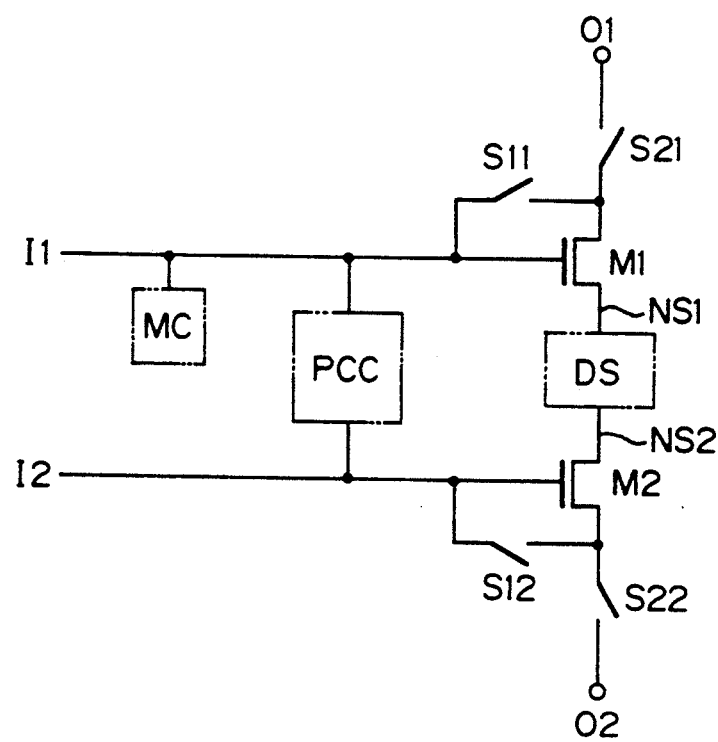
FIG. 3 is a diagram showing a first embodiment according to the present invention.

FIG. 3 shows a first embodiment of the device according to the present invention. This structure includes MOS transistors M1 and M2 constituting a sense amplifier circuit. In general, characteristics of these amplifying transistors M1 and M2 are different from each other. I1 and I2 respectively denote paired signal lines connected to gate regions of the transistors M1 and M2, respectively. PCC stands for an initial voltage setting circuit and MC indicates a dynamic memory cell employed as a signal generator having a switch connected to the signal line I1. The memory cell MC of FIG. 3 is connected only to the signal line I1; however, the cell MC may be linked only to the line I2 in some cases. Alternatively, the cell MC may be connected to both of I1 and I2 depending on cases. DS stands for a potential supply circuit for applying an identical potential to source regions NS1 and NS2 respectively of the transistors M1 and M2. S11 and S12 are switches respectively disposed between drain and gate regions of the transistors M1 and M2, respectively. S21 and S22 designate switches respectively arranged between the drain region and a terminal O1 and the drain region and a terminal O2 of the transistors M1 and M2, respectively.

Referring now to the graph of FIG. 4, description will be given of the first embodiment of FIG. 3. First, the switches S11, S12, S21, and S22 are off. In this situation, the source regions of the transistors M1 and M2 are at an identical potential VP1 supplied from the initial voltage setting circuit PCC. Moreover, the paired signal lines I1 and I2 are set by the circuit PCC to a voltage HVD higher than the potential VP1 by at least the maximum value of the threshold voltages of the transistors M1 and M2. The terminals O1 and O2 are set to appropriate voltages.

Next, when the switches S11 and S12 are turned on, a short circuit is established between the gate and drain regions in each of the transistors M1 and M2. In consequence, since the source region is kept remained at the fixed potential VP1, electric charges of the gate (drain) I1 of the transistor M1 are discharged via the transistor M1 such that the potential thereof is lowered to the potential VP11 of the source region NS1, the potential VP11 being higher than the potential VP1 by the threshold voltage of the transistor M1. Similarly, the potential of the gate (drain) region I2 is decreased through a discharge operation via the transistor M2 to the potential VP12 of the NS2, the potential VP12 being higher than the potential VP1 by the threshold voltage of the transistor M2.

After the voltages VP11 and VP12 are respectively developed on the signal lines I1 and I2, when the switches S11 and S12 is turned off to set the source regions NS1 and NS2 to a lower potential VE, each of the transistors M1 and M2 is set to a state ready for allowing a current to flow therethrough according to the gate voltage.

In this situation, assuming e.g. that the threshold voltage of the transistor M2 is higher than that of the transistor M1, the potential VP12 becomes higher than the potential VP11. Resultantly, in a state of the transistor M2 in which the current flow is hindered, the gate voltage of the transistor M2 is increased to remove the hindrance against the current, thereby cancelling the threshold difference i.e. thereby allowing an identical current to flow through the transistors M1 and M2.

When the switch disposed in the MC is turned on in this situation to supply a signal onto the signal line I1, a differential current corresponding to the signal difference can be passed through the transistors M1 and M2. The current difference is associated with the cancellation of the threshold voltage difference between the transistors M1 and M2.

Subsequently, when the switches S21 and S22 are closed, the current difference can be developed on the output terminals O1 and O2. The switches S21 and S22 need be closed only after the switches S11 and S12 are turned off. As above, with the provision of the circuit, for each differential sense amplifier, the variation in threshold value between the MOS transistors constituting the differential sense amplifier can be compensated for, thereby achieving a highly reliable device operation at a high speed.

Figure 4:
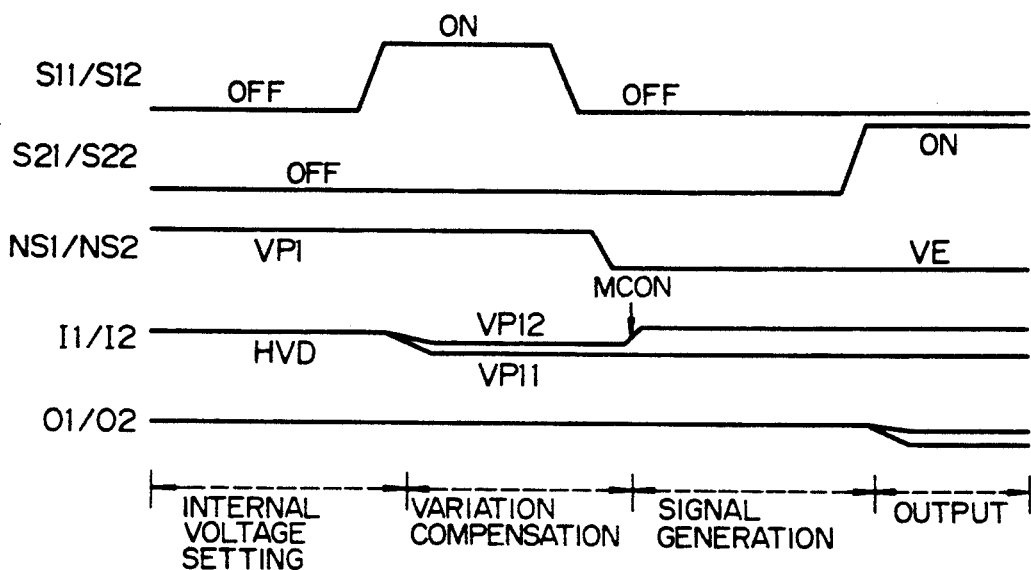
FIG. 4 is a graph for explaining the operation of the first embodiment according to the present invention.

In this connection, according to the configuration of FIG. 4, with the source regions NS1 and NS2 fixed to the potential VP1, the switches S11 and S12 are turned on to compensate for the variation in characteristics between constituent transistors. However, it may also be possible to change the potential of the source regions NS1 and NS2, with the switches S11 and S12 kept remained in the on state, from a high potential turning the transistors M1 and M2 on to the potential VP1, thereby compensating for the variation in characteristics between the constituent transistors. In addition, in the semiconductor IC device according to the present invention, the initial voltage setting and the variation compensation may be conducted after the device is selected by a control input signal for initiation thereof, for example, a chip selection signal. Moreover, the initial voltage setting or the variation compensation may be carried out immediately after the device is set to a free state i.e. after the device is released from the selected state.

Figure 5:
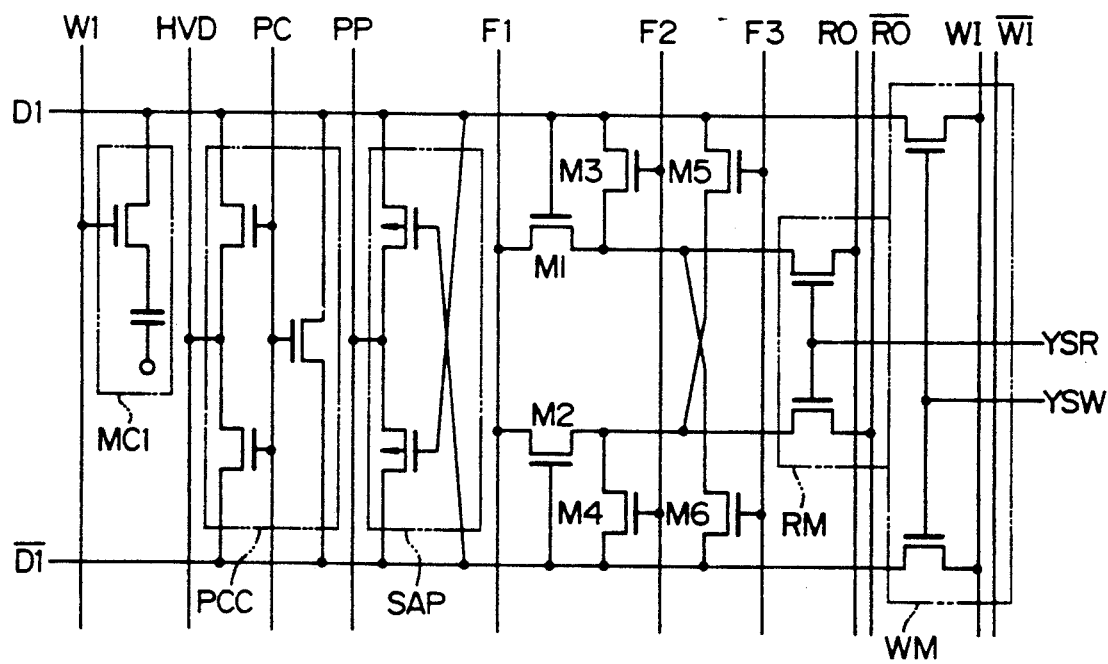
FIG. 5 is a diagram illustratively showing a second embodiment according to the present invention.

FIG. 5 shows the configuration of a second embodiment. This is an example of an amplifier circuit of a DRAM.

MC1 is a memory cell storing data therein. When a word line W1 is selected, the data is outputted from the memory cell MC1 to a data line D1. D1 and /D1 denote input/output terminals of a sense amplifier constituted with MOS transistors M1 to M6. PCC stands for a precharge circuit for establishing a short circuit between the terminals D1 and /D1 to precharge them to an identical potential HVD. PC designates a signal controlling the precharge circuit PCC. HVD denotes a power source for the precharge operation. SAP indicates a sense amplifier constituted with MOS transistors. The input/output terminals D1 and /D1 are also disposed for this amplifier SAP. PP designates a signal controlling the precharge circuit SAP. RM denotes a MOS circuit as a read switch for connecting signals on the terminals D1 and /D1 to a circuit in a subsequent stage. YSR is a signal controlling the read switch RM. WM indicates a MOS circuit as a write switch for transmitting write signals from the MC1 via the word lines W1 and /W1 to the data lines D1 and /D1. YSW is a signal controlling the write switch WM. Each of the control signals is used as a column selection signal and is produced as a Y decoder output signal.

Figure 6:
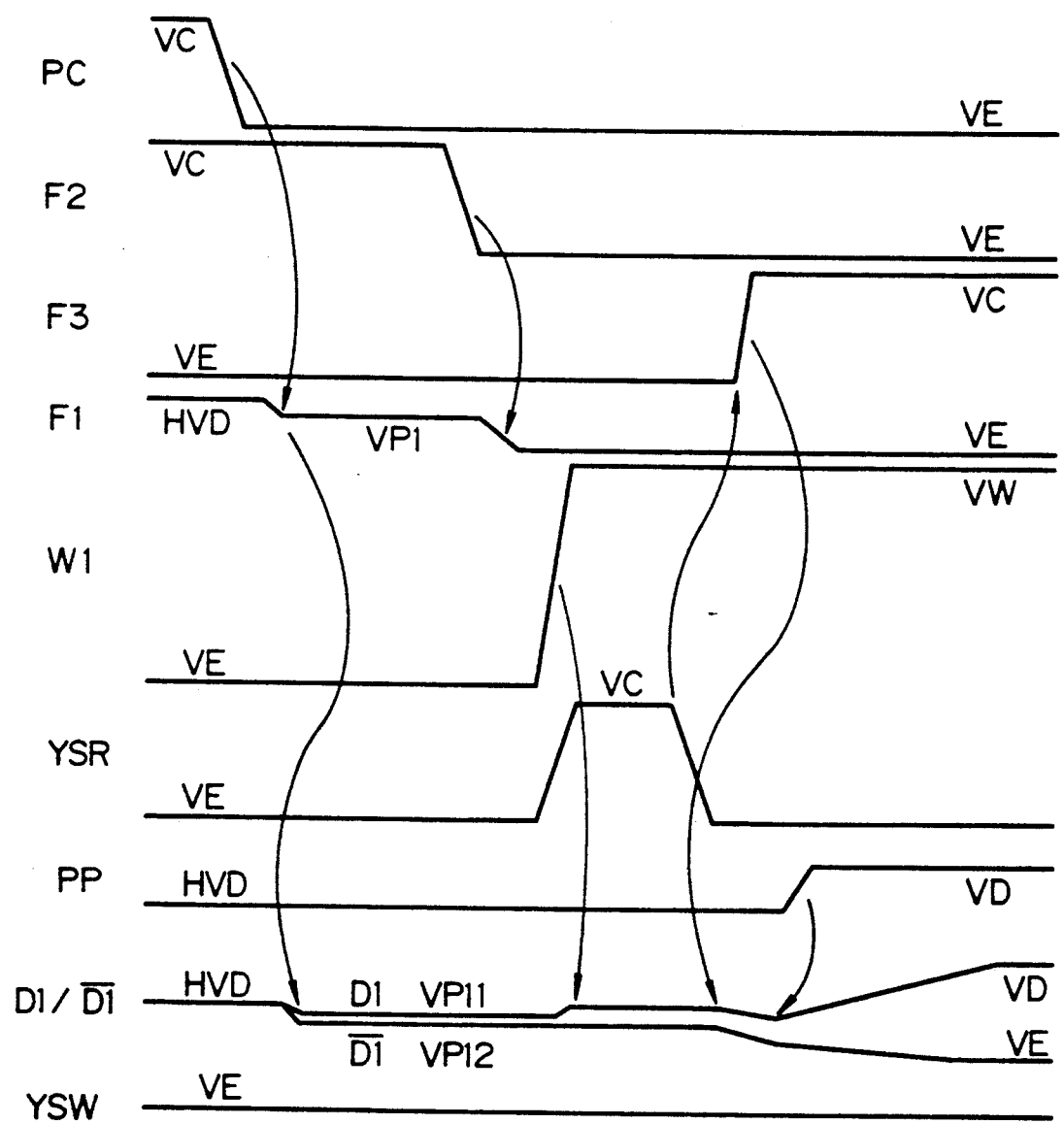
FIG. 6 is a graph useful to explain the operation of the second embodiment according to the present invention.

Referring now to the graph of FIG. 6, description will be given of the operation of the embodiment. First, the control signal PC is at a high-level potential VC and the terminals D1 and /D1 are precharged to a potential HVD. Control signals or lines F1 and F2 are respectively at the potential HVD and the high level VC and hence MOS transistors M3 and M4 are on. A line F3 is at a low level VE and hence MOS transistors M5 and M6 are off. Moreover, the word line W1 and the control signal YSR are at the low level VE and the control signal PP is at the voltage HVD. The control signal YSW is at the low level VE in an operation other than the operation in which a signal is written in the memory cell MC1. The MOS transistors in the write switch WM are off.

First, the control signal PC is changed from the high level VC to the low level VE to set the lines D1 and /D1 to a floating state. Thereafter, when the line F1 is altered from the potential HVD to a potential VP1, since the MOS elements M3 and M4 are on, the voltages of the lines D1 and /D1 are lowered to the voltages VP11 and VP12 respectively related to the threshold voltages VT of the transistors M1 and M2. Namely, VP11 = VP1 + VT(M1) and VP12 = VP1 + VT(M2).

Assuming, for example, that the threshold voltage of the transistor M2 is less than that of the transistor M1, the voltage VP12 of the line /D1 becomes lower than the voltage VP11 of the line D1. Resultantly, a state of the transistor in which the current can be easily passed therethrough due to the low threshold voltage is changed by setting the voltage of the line /D1 i.e. the gate voltage of the MOS transistor to be lower than the voltage of the line /D1, thereby cancelling the effectiveness of the threshold voltage. Due to the potential levels VP11 and VP12, there is formed a state in which an identical current flows through the elements M1 and M2.

Thereafter, the lines F1 and F2 are set to the low level VE. When the word line W1 is changed from the low level VE to the high level VW, signals are delivered from the memory cell MC1 onto the data line D1, thereby developing inherent differential voltage signals on the lines D1 and /D1.

In this situation, the control signal YSR is altered from the low level VE to the high level VC and hence the terminals RO and /RO are supplied with current difference signals corresponding to the differential voltage signals. The current difference reflects cancellation of the current difference caused by the variations in the threshold values between the transistors M1 and M2. The current difference between the terminals RO and /RO is acquired as a voltage difference by a circuit in the subsequent stage disposed to latch a signal therein, which will be described later. As a result, the control signal is changed from the high level VC to the low level VE and then the MOS elements are turned off in the read switch RM.

Next, a re-write operation is initiated, namely, the line F3 is set to the high-level potential VC to turn the elements M5 and M6 on so as to form a sense amplifier circuit of an ordinary configuration in which the elements M1 and M2 are connected to each other via the gate regions and drain regions in a so-called cross connection. In this constitution, the voltage difference between the lines D1 and/D1 is amplified. Since the voltage difference appearing between the lines D1 and /D1 in this state is of a value attained by cancelling the difference between the threshold values of the elements M1 and M2, the voltage amplification is carried out at a high speed. When a signal having a predetermined voltage is generated, the control signal PP is changed from the voltage HVD to the voltage VD to achieve amplification. Namely, the voltages of the lines D1 and /D1 are set to the high level VD and the low level VD, respectively. Thereafter, a rewrite operation is executed onto the memory cell MC1. Although the threshold voltage varies between the MOS transistors of a p-type channel in the sense amplifier SAP, the threshold voltage difference exercises little influence upon the operation thanks to a high signal voltage thus generated.

As above, according to the embodiment, the elements M3 and M4 are turned on by the potential of the control signal F1 so that the data lines D1 and /D1 are beforehand set to appropriate voltages reflecting the variations in threshold voltages of the elements M1 and M2. Thereafter, in response to a very small voltage difference produced between the lines D1 and /D1 by a signal from the memory cell MC1, there is generated a current difference between the elements M1 and M2 in association with the voltage difference. Moreover, the amplitude of the differential voltage is amplified by the elements M1 and M2. In consequence, the operation margin and speed are not adversely influenced by the difference in the threshold voltage between the elements M1 and M2. Moreover, there is attained an advantage that each of the amplifier circuits can be established for operation according to the respective characteristics thereof. In this configuration, the elements M5 and M6 and the amplifier SAP may be dispensed with to suppress the ordinary sense amplifier operation. Furthermore, in the example of FIG. 6, the power sources VC, VE, VD, and VW develop 2.0 V, 0.0 V, 1.5 V, and 2.5 V, respectively. In addition, as an example of the memory cell MC1, there may be considered an ordinary DRAM including a transistor and a capacitor, a special DRAM cell such as a twin cell using two transistors and a capacitor, a gain cell including two or three transistors, or a non-volatile cell using a dielectric substance; an SRAM cell adopting four transistors and two load resistors or six transistors, or a non-volatile cell including an EEPROM.

Figure 7:
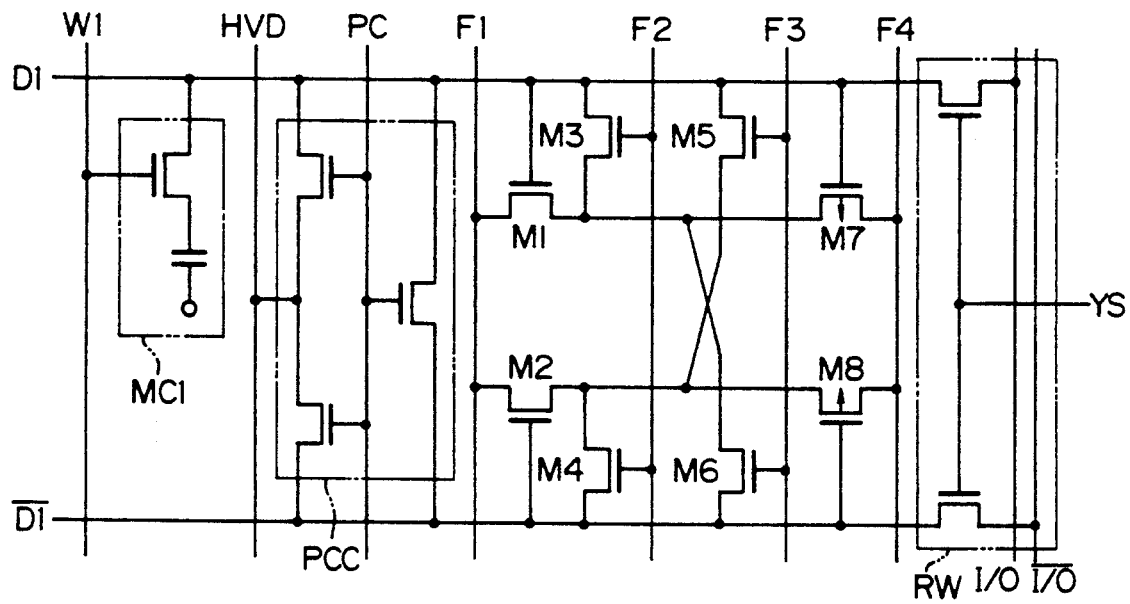
FIG. 7 is a schematic diagram showing a third embodiment according to the present invention.

FIG. 7 shows the configuration of the third embodiment according to the present invention. The memory cell MC1 and the initial voltage setting circuit PCC of the second embodiment of FIG. 5 are also employed in the third embodiment. However, the read switch RM and the write switch WM are omitted such that there is disposed a circuit RW shared for the read and write operations to establish connections to a read/write circuit. YS stands for a signal controlling the circuit RW, and I/O and /I/O are also adopted as output terminals in a read operation and as input terminals in a write operation. Moreover, the MOS elements of a p-type channel constituting the amplifier SAP are arranged as elements M7 and M8 in this configuration. A signal F4 corresponds to the signal F3 of the elements M1 and M2.

Figure 8:
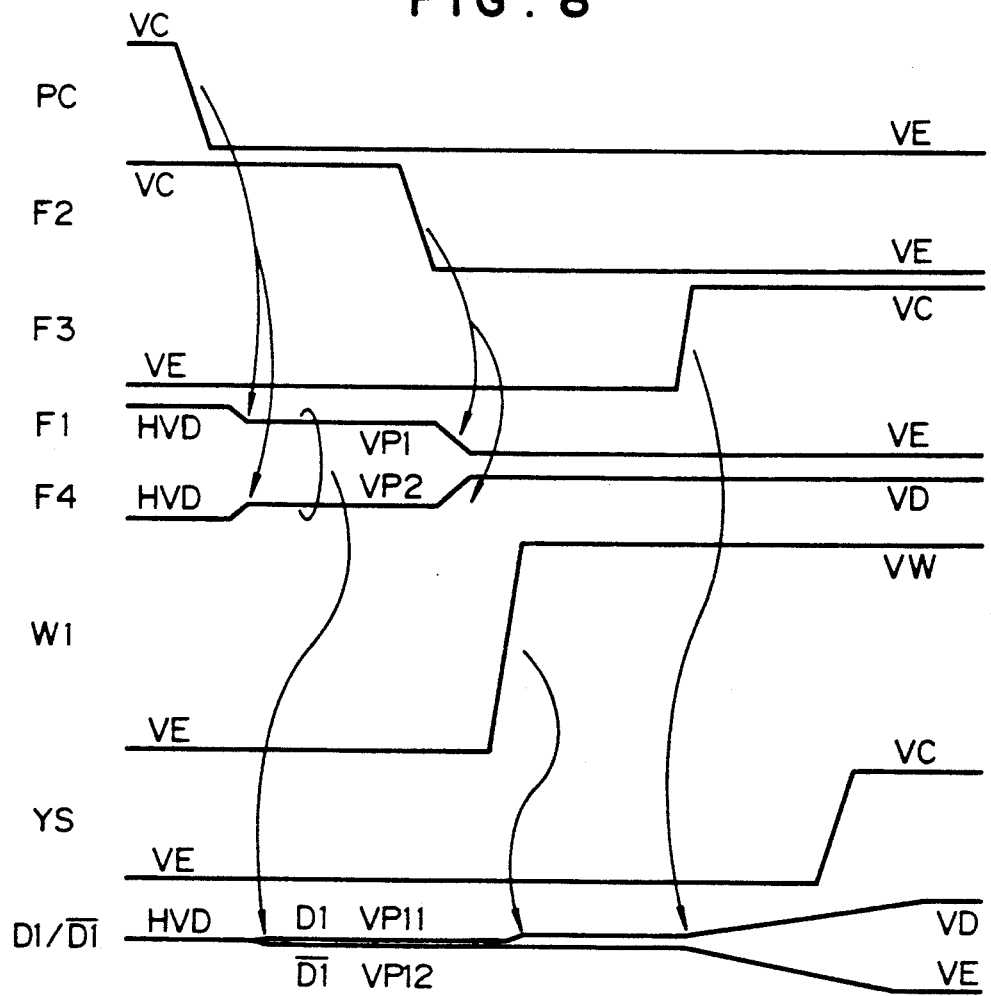
FIG. 8 is a graph for explaining the operation of the third embodiment according to the present invention.

Referring to the graph of FIG. 8, description will be given of the operation of the system of FIG. 7. First, the control signal PC is at the high level VC and the line D1 and /D1 are precharged to the voltage HVD. Since the signals F2 and F3 are respectively at the high level VC and the low level VE, the element M3 and M4 are turned on and the elements M5 and M6 are turned off. The signals F1 and F4 are at the potential HVD, whereas the word line W1 and the control signal TS are at the low level VE.

In this situation, when the control signal PC is set to the low level VE, the lines D1 and /D1 are set to a floating state. The signals F1 and F4 are respectively changed from the potential HVD to the VP1 and VP2. Since the elements M3 and M4 are on, the variations in the threshold voltage between the elements M1, M2, M7, and M8 exert influence upon each other such that the lines D1 and /D1 are precharged to the voltages VP11 and VP12 so as to develop equivalently in-phase inputs of the overall amplifier circuit constituted with the four MOS elements.

That is, the precharge voltage VP11 of the line D1 is used as a logic threshold voltage of the CMOS inverters M1 and M7 having input and output terminals short-circuited by the element M3, whereas the precharge voltage VP12 of the line /D1 is adopted as a logic threshold voltage of the CMOS inverters M2 and M8 having input and output terminals short-circuited by the element M4.

Thereafter, the signal F2 is changed to the low level VE, the signal F3 is fixed to the level VE, the signal F1 is changed to the level VE, and the signal F4 is changed to the level VD.

In this state, the word line W1 is set to the high level VW such that signals are delivered from the MC1 onto the data line D1. Subsequently, the signal F3 is set to the high level VC and then the amplification is started by the two CMOS inverters. However, since the voltage difference developed between the lines D1 and /D1 is a value attained by cancelling out the variations in threshold values between the MOS elements constituting the amplifier, the signal amplification is accomplished at a high speed.

When the amplification is achieved to a certain extent, the signal YS is set to the high level VC to deliver the signals via the terminals I/O and /I/O to the circuit in the succeeding stage. As above, with the provision of this embodiment, even when the threshold voltage varies between the MOS elements forming the amplifier circuit, a high-speed amplification can be achieved by using the appropriate different precharge voltages. Moreover, the precharge voltages can be set depending on characteristics of the respective amplifier circuits.

Figure 9:
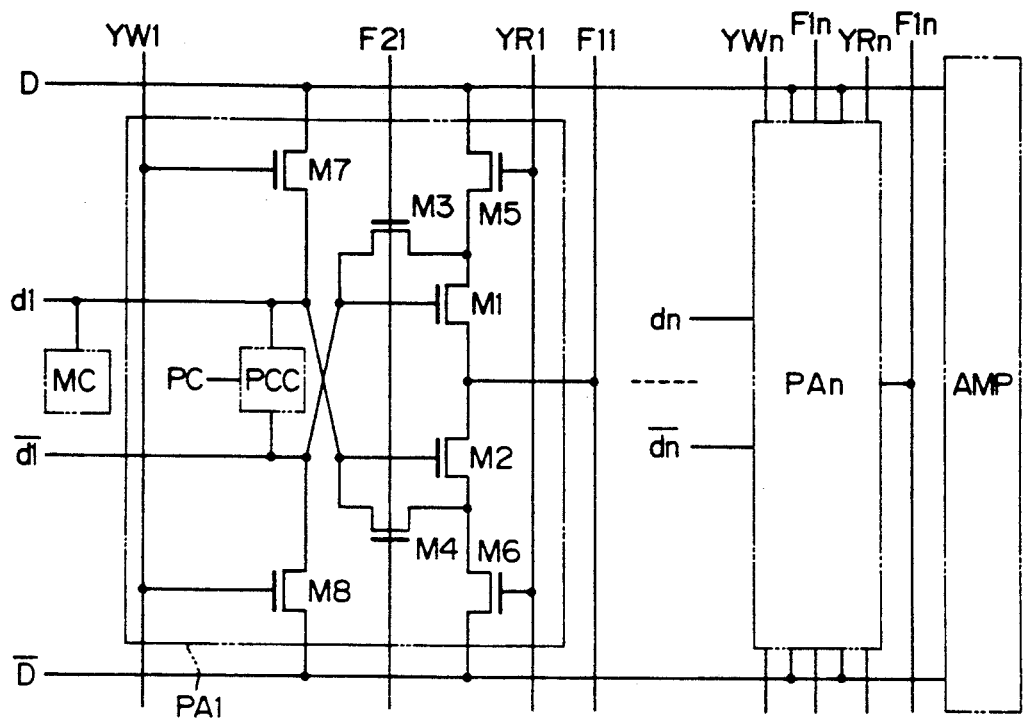
FIG. 9 is a diagram illustratively showing a fourth embodiment according to the present invention.

FIG. 9 shows the structure of the fourth embodiment according to the present invention. The configuration of this diagram includes data line pairs {d1,/d1}, ..., {dn,/dn} and preamplifiers PA1 to PAn receiving the data line pairs, respectively.

The preamplifier PA1 includes MOS transistors M1 and M2 of which gate regions are connected to the data lines d1 and /d1, respectively. F11 indicates a shared source driving line. M3 denotes a MOS transistor establishing a connection between the drain and gate regions of the transistor M1, whereas M4 indicates a MOS transistor connecting the drain region to the gate region of the transistor M2. The ga%e terminals of the transistors M3 and M4 are controlled by a signal F21.

M5 denotes a MOS element connecting the drain region of the transistor M1 to a common data line D. M6 stands for a MOS transistor connecting the drain region of M2 to a common data line /D. Gate regions of the elements M5 and M6 are controlled by a signal YR1.

M7 indicates a MOS transistor connecting the data line d1 to the common data line D, whereas M8 designates a MOS transistor establishing a connection between the data line /d1 and the common data line /D. Gate regions of the elements M7 and M8 are supervised by a signal YW1. MC denotes a memory cell as a signal generator circuit, PCC stands for a circuit establishing the initial voltage HVD, and PC indicates a signal line controlling the initial voltage setting circuit PCC.

Figure 23:
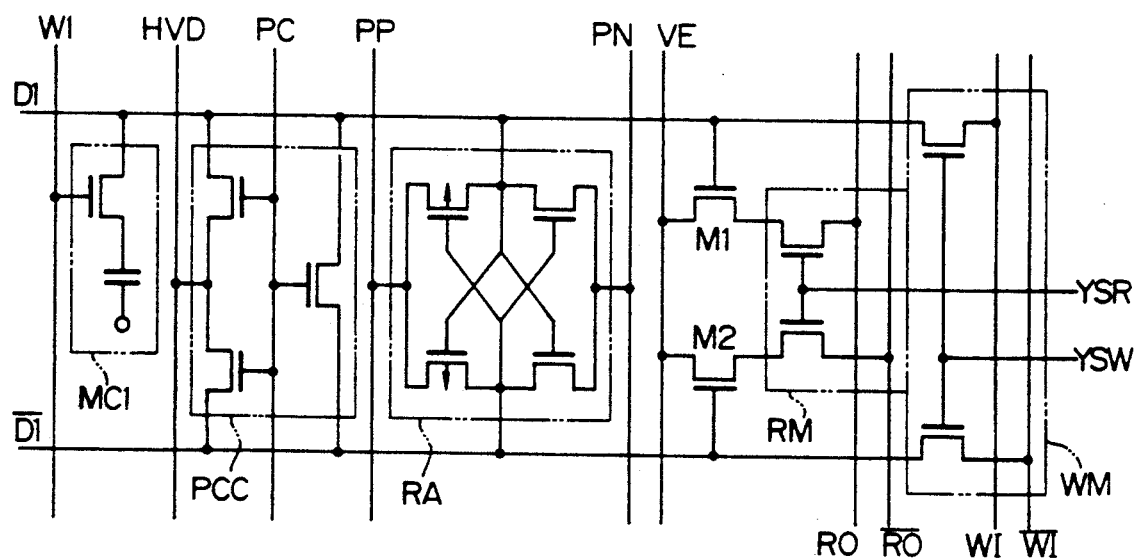
FIG. 23 is a diagram showing a conventional example of a DRAM configuration.
Figure 24:
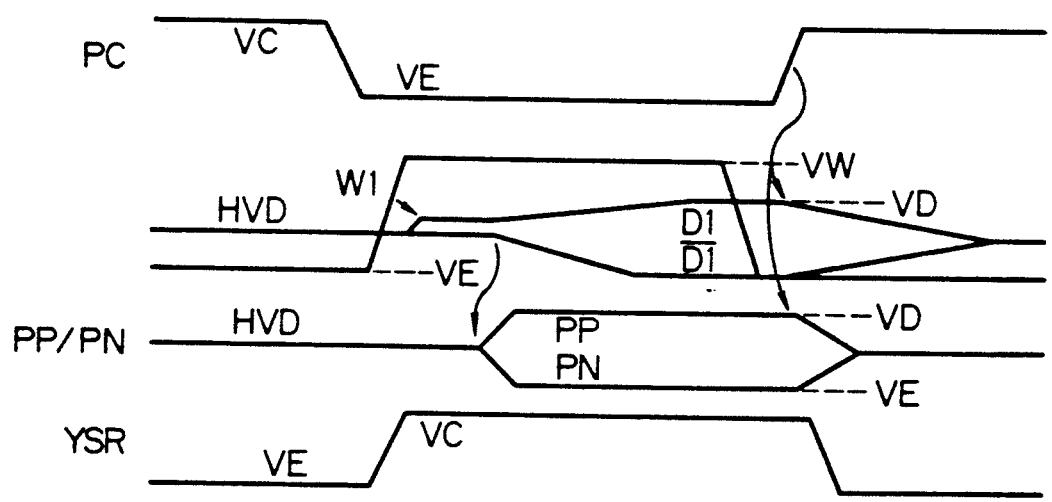
FIG. 24 is a graph for explaining the operation of the conventional example of FIG. 23.

AMP denotes an amplifier circuit for achieving amplification on signals generated on the common data lines D and /D. Replacing D and /D respectively with D1 and /D1, the circuit used in FIG. 5, 7, or 23 may possibly employed in this example. Moreover, replacing D and /D respectively with RO and /RO, the circuit of FIG. 15 may be adopted.

Figure 10:
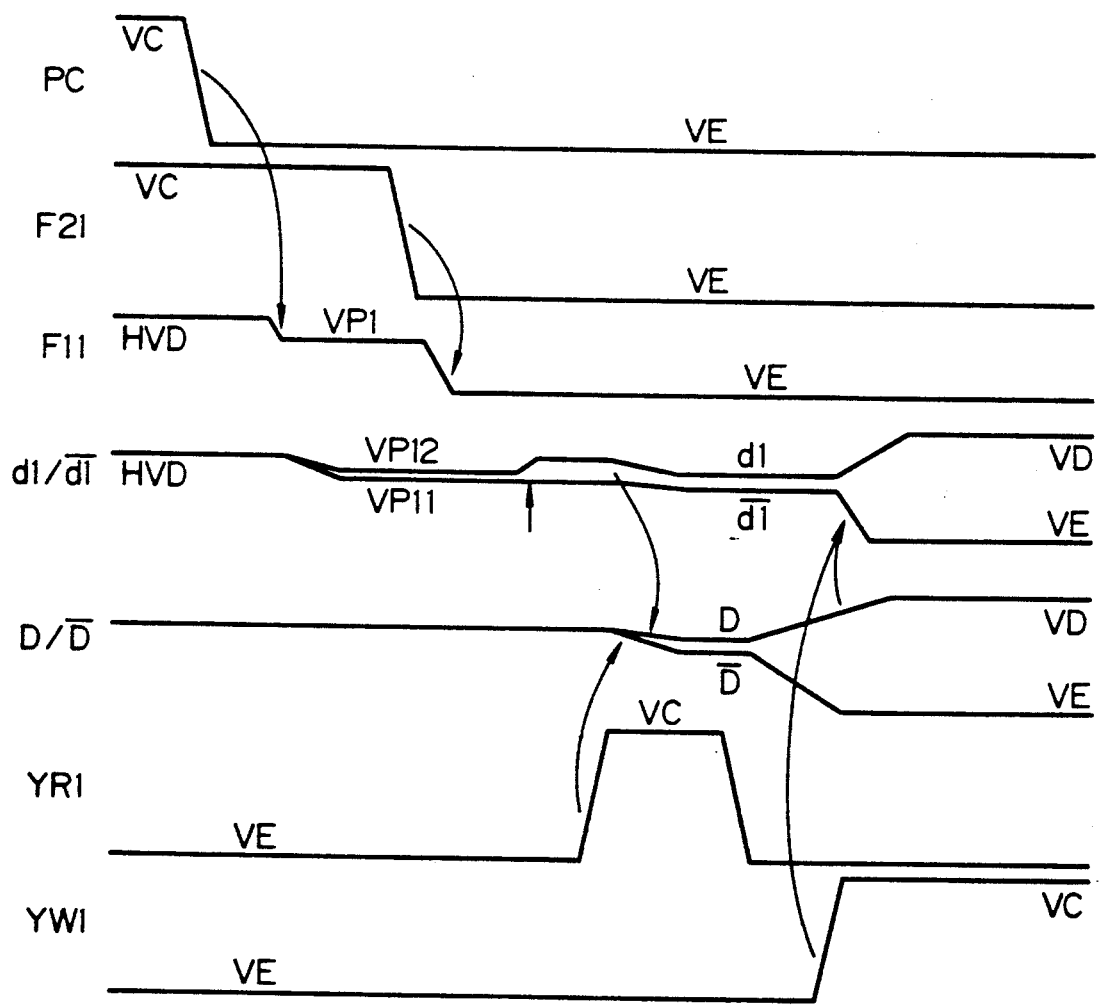
FIG. 10 is a graph useful to explain the operation of the fourth embodiment according to the present invention.

Referring now to the graph Of FIG. 10, description will be given of the circuit of FIG. 9. The control signal PC is first at a high level and hence the lines d1 and /d1 are precharged to the level HVD. The signal YW1 is at a low level and hence the elements M7 and M8 are off and hence an electric connection is not established between the lines d1 and D nor between the lines /d1 and /D. Moreover, since the control signal F21 is at the high level VC, the transistors M3 and M4 are on and an electric connection is established between the drain and gate regions of each of the elements M1 and M2.

The control signal YR1 is at a low level and hence the drain regions respectively of the elements M1 and M2 are not electrically connected to the lines D and /D, respectively.

In addition, the signal F11 is at the level HVD. The lines D and /D are at appropriate voltages so that when the elements M5 and M6 are turned on to set the signal F11 to a low level, there flows a current through the elements M1 and M2.

Next, the control signal PC is set to a low level to turn the initial voltage setting circuit PCC off and then the lines d1 and /d1 are set to a floating state.

Subsequently, when the common source driver line F11 is changed from the level HVD to the level VP1, since the transistors M3 and M4 are on, the lines d1 and /d1 undergo a discharge operation toward the line F11 to associated voltages which are higher than the voltage VP1 by the threshold voltages of the MOS elements, respectively. Namely, the lines d1 and /d1 are set to the voltages VP12 and VP11, respectively. This resultantly cancels out the variation in the threshold voltage between the elements M1 and M2. Thereafter, the line F21 is set to the low level VE to turn the elements M3 and M4 off, thereby setting the line F11 to the low level VE. In this situation, the memory cell MC is turned on to produce a differential signal voltage between the lines d1 and /d1. When the signal YR1 is set to a high level in this state, the elements M5 and M6 are turned on and hence signal currents or voltages associated with the signals on the lines d1 and /d1 appear on the line D and /D.

Thereafter, in the configuration of FIG. 9, the signal attained from the lines D and /D is received by the amplifier AMP to develop through an amplification a signal having an amplitude VD−VE. The lines YR1 and YW1 are then set respectively to the low and high levels to re-write the voltage difference signals from the lines D and /D onto the lines d and /d.

Also in the amplifier circuit AMP, the precharge voltages of the lines D and /D may be changed according to the variation in the threshold voltage between the MOS elements of the amplifier AMP. In such a case, the preamplifiers PA1 to PAn of FIG. 9 can be regarded as the memory cell MC1 Of FIG. 5 or 7. Moreover, in a write operation, the lines YR1 and YW1 are set respectively to the low and high levels to generate write signals on the lines D and /D from the amplifier AMP so as to select the memory cell MC, thereby accomplishing a write operation therein. According to the present invention, in addition to an advantage that the operation margin and speed are not influenced by the variation in characteristics among the MOS elements, there is attained an advantage. Namely, since the data line pairs are only connected respectively to the preamplifiers PA1 to PAn including only MOS elements of an n-type channel and operations such as a rewrite operation is conducted through the shared amplifier AMP, the area necessary for the CI element layout can be reduced. In association therewith, the parasitic capacitance of the lines d1 and /d1 can also be minimized and hence a high-voltage signal can be obtained from the memory cell MC to be sent in the form of complementary signals to the lines d1 and /d1.

Figure 11:
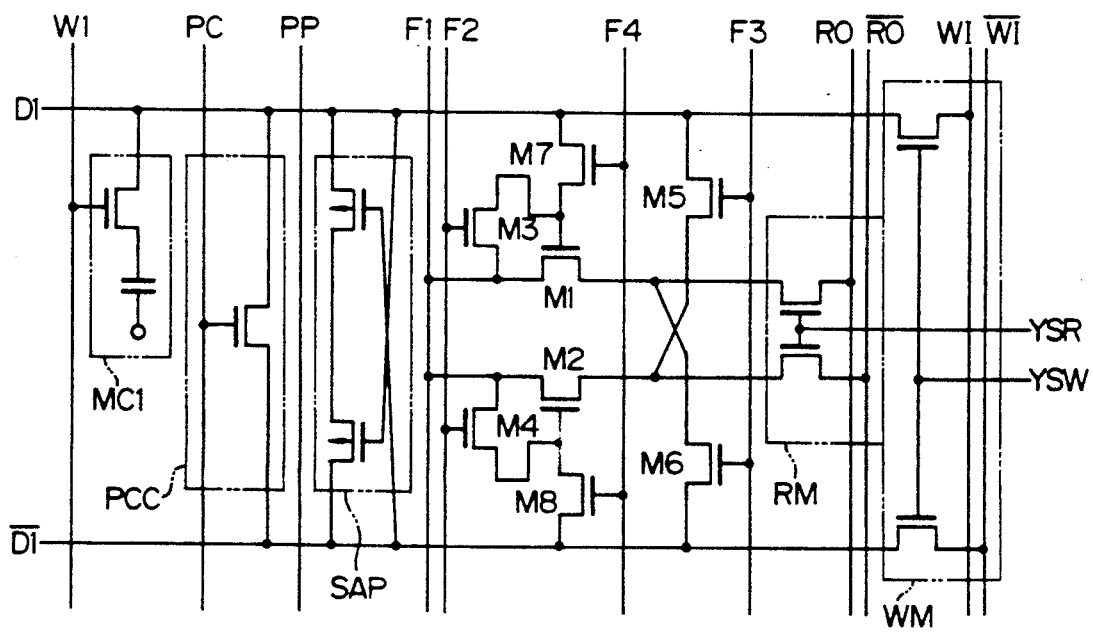
FIG. 11 is a schematic diagram showing a fifth embodiment according to the present invention.

FIG. 11 shows the constitution of the fifth embodiment according to the present invention.

This embodiment is implemented by modifying the circuit system described in the JP-A-56-21897 to provide a function similar to that of FIG. 5.

The JP-A-56-21897 has disclosed only an operation of a known Vcc precharge operation method in which the threshold variation is compensated for in an amplification method to develop a large amplitude for signals on data lines. However, description has not been given of a method of directly reading a very small signal in a ½ Vcc precharge operation.

In the configuration of FIG. 11, transistors or elements M1 and M2 form a MOS differential amplifier, transistors M3 to M6 are employed as switching MOS elements for compensating for the threshold value variation between the elements M1 and M2, and transistors M7 and M8 are used as switching MOS elements for connecting gate regions of the elements M1 and M2 to data lines D and /D1. The elements M5 and M6 are also used to achieve a rewrite operation. The other constitution is the same as that of FIG. 5 excepting that the initial voltage setting circuit PCC includes only one MOS element.

Figure 12:
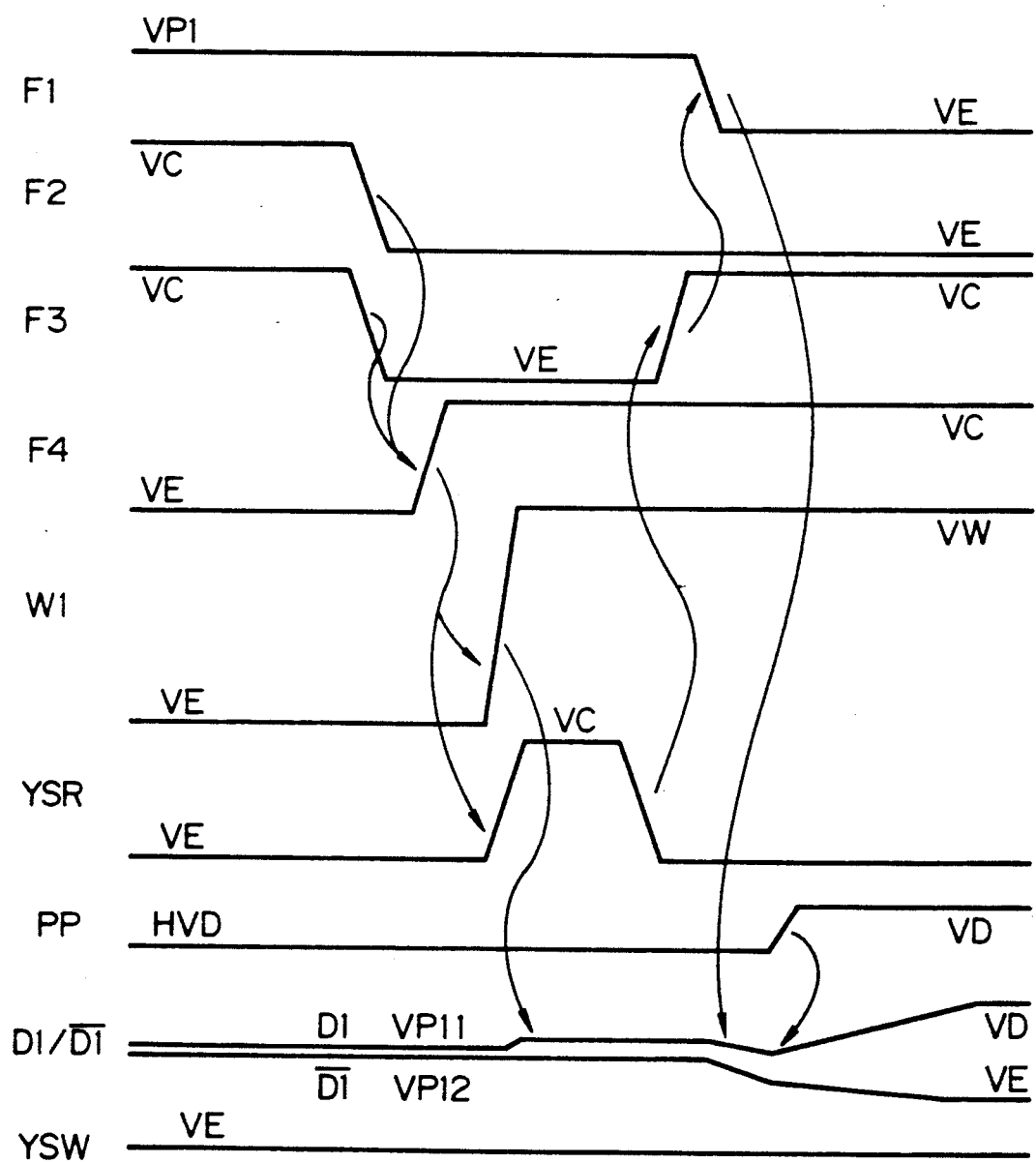
FIG. 12 is a graph for explaining the operation of the fifth embodiment according to the present invention.

Referring now to the graph of FIG. 12, description will be given of the operation of the circuit system of FIG. 11. The signals F2 and F3 are first at a high voltage and hence the elements M3 to M6 are on. Under this condition, the line F1 is set to the voltage VP1 to apply to the data line D1 the voltage VP11 which is lower than the voltage VP1 of the signals F1 by the threshold voltage of the element M2. Moreover, the data line /D1 is applied with the voltage VP12 which is lower than the voltage VP1 of the signal F1 by the threshold voltage of the element M1.

In this state, the signals F2 and F3 are set to a low level to turn the elements M3 to M6 off. Thereafter, the signal F4 is set to a high level to turn the elements M7 and M8 on. In this situation, the gate region of the transistor M1 is applied with the voltage VP11 of the line D1 which is lower than the voltage VP1 by the threshold voltage of the element M2, whereas the gate region of the element M2 is applied with the voltage VP12 of the line /D1 which is lower than the potential VP1 by the threshold voltage of the element M2.

Accordingly, in a state where, for example, the threshold voltage of the element M1 is higher than that of the element M2 to hinder a current from flowing into the element M1, the low voltage reflecting the threshold voltage difference is applied to the gate region of the element M2. Consequently, the current is similarly hindered from flowing into the element M2, namely, the variation in the threshold voltage between these transistors is cancelled out.

Thereafter, the word line W1 is set to a high level such that a read signal voltage difference related to the content of the memory cell MC is developed between the data lines D1 and /D1. The associated signals are inputted via the elements M7 and M8 to the gates of the elements M1 and M2.

The signal YSR is then set to a high level to turn the switching circuit RM on to produce signal currents on the terminals RO and /RO. When a signal attained from the signals on the terminals RO and RO is latched by a circuit in the subsequent stage, the signal YSR is set to a low level to turn the circuit RM off, thereby passing control to a re-write operation.

In the re-write operation, the signal F3 is first set to a high level to turn the elements M5 and M6 on so that the transistors M1 and M2 cooperatively function as a flip-flop circuit. Thereafter, the signal F1 is set to a low level such that very small signals from the data lines are amplified by the elements M1 and M2 and the elements M5 and M6. When the amplification is accomplished to a certain extent, the signal PP is set to a high level to achieve a write operation of the signal on the data line at the high level.

In the second embodiment of FIG. 5, the data lines are precharged by the circuit PCC and are then discharged via the signal line F1 to compensate for the variation in the threshold value between the elements. In contrast thereto, according to the fifth embodiment of FIG. 11, the threshold value variation can be compensated for only through the discharge operation via the line F1, which leads to advantages that the configuration of the precharge circuit PCC is simplified and the signal line F1 is easily controlled.

In the embodiments of FIGS. 5, 7, and 9, the line F1 of FIG. 5, the lines F1 and F4 of FIG. 7, and the line F11 of FIG. 9 are varied between two potential stages as described above.

Figure 13:
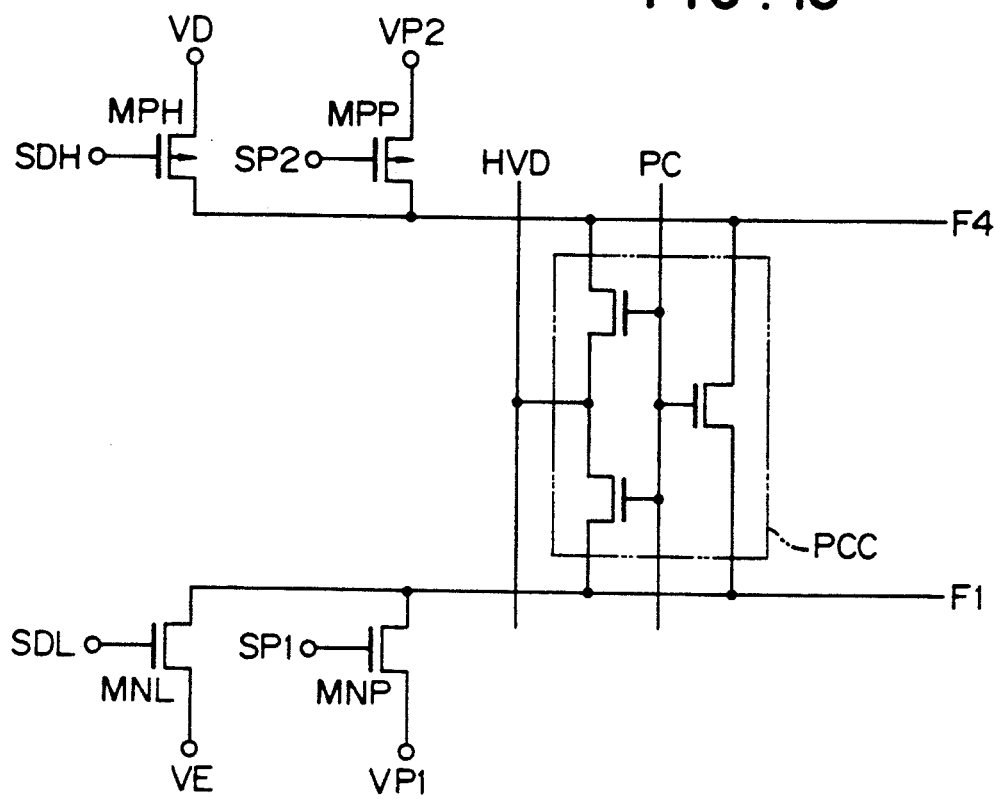
FIG. 13 is a diagram showing a portion of a control circuit in an embodiment according to the present invention.

This can be easily accomplished by a circuit constitution shown in FIG. 13. Referring to this circuit diagram, description will be given of a case where the voltages of the lines F1 and F4 are altered. In the embodiments of FIGS. 5 and 9, the portion related to the line F1 of the diagram of FIG. 13 need only be applied to the lines F1 and F11. In FIG. 13, MPH stands for a MOS element of a p-type channel for supplying a voltage VD to the line F4. The MOS element MPH is controlled by a signal SDH. MPP indicates a MOS element of a p-type channel for supplying a voltage VP2 to the line F4. The MOS element MPP is supervised by a signal SP2. MNL denotes a MOS element of an n-type channel for supplying a voltage VE to the line F1. The element MNL is controlled by a signal SDL. MNP stands for a MOS element of an n-type channel for supplying a voltage VP1 to the line F1. PCC indicates a precharge circuit for supplying an initial voltage HVD to the line F4. The circuit PCC is controlled by a line PC.

Figure 14:
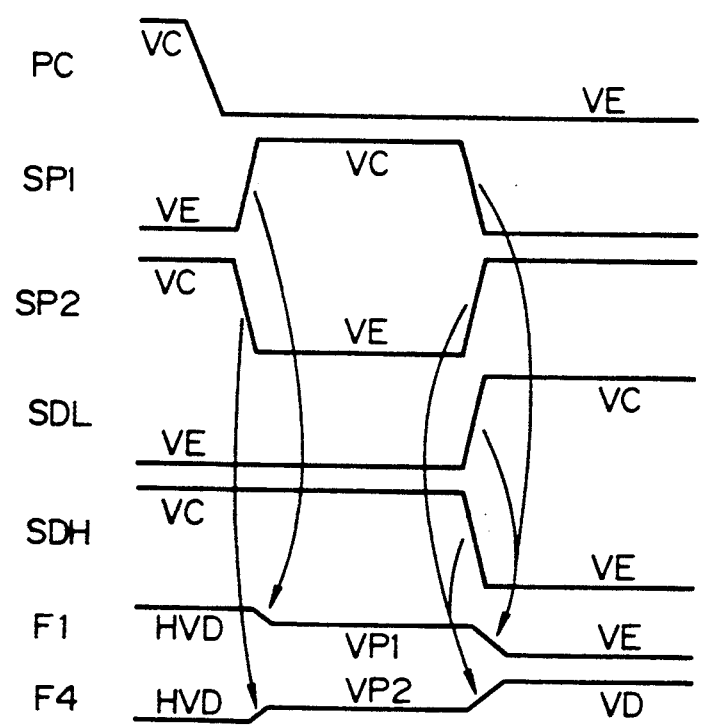
FIG. 14 is a graph useful to explain the operation of the circuit of FIG. 13.

Referring now to the graph of FIG. 14, description will be given of the circuit of FIG. 13. The line PC is first at the high level VC and the lines F1 and F4 are precharged to the level HVD. The signals SP1, SP2, SDH, and SDL are at the low level VE, the high level VC, the high level VC, and the low level VE, respectively. The elements MPP, MNP, MPH, and MNL are off in this situation.

First, the signals SP1 and SP2 are set to the high level VC and the low level VE, respectively. Moreover, the lines F4 and F1 are set to the voltages VP2 and VP1, respectively. As a result, there are developed precharge voltages associated with the variation in the threshold voltage between the MOS elements constituting the sense amplifier circuits described in conjunction with FIGS. 5 to 10.

Thereafter, in the line F1, the signals SP1 and SDL are set respectively to the low level VE and the high level VC, thereby supplying the voltage VE.

In this regard, in a case where the circuit of FIG. 13 is to be adopted in the embodiment FIG. 5, it is only necessary to omit the element MPP. The signal F4 correspond in this situation to the signal PP. In the case of FIG. 9, although only the line F1 is to be considered, when the present invention is applied to the amplifier AMP, the lines F1 and F4 of FIG. 13 can be used. With provision of the circuit as above, the necessary voltages can be easily generated on the lines PP and F3 of FIG. 5, the lines F1 and F4 of FIG. 7, and the line F11 of FIG. 9.

Subsequently, the latch circuit described above will be described by reference to an example of this circuit shown in FIG. 20. Namely, as described above, while the control signal is retained at the high level in FIGS. 5 and 11, in a circuit disposed in a subsequent stage connected to the lines RO and /RO, the current signals generated thereon are to be latched.

Figure 20:
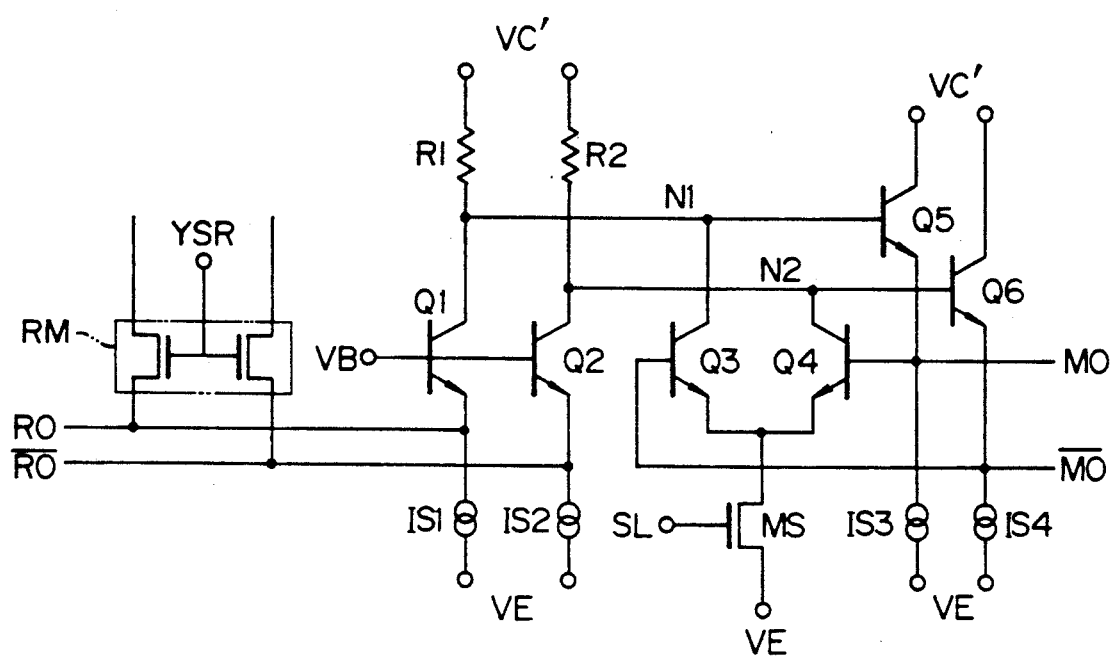
FIG. 20 is a diagram showing a portion of a read circuit in an embodiment according to the present invention.

In FIG. 20, Q1 to Q6 are bipolar transistors, R1 and R2 denote resistors, IS1 to IS4 indicate current sources, and MS stands for a MOS element for the current sources IS1 to IS4. The MOS element is controlled by a signal SL.

The bipolar transistors Q1 and Q2 are employed with base regions thereof connected to a ground potential to clamp terminals RO and /RO to a voltage which is lower than a base voltage VB by a base-emitter forward-directional voltage VBE, thereby suppressing voltage variation thereof.

The transistors Q3 and Q4 constitute a current switch. The current source MOS transistor MS is supervised by the signal SL.

The transistors Q5 and Q6 form an emitter follower circuit. These transistors have inputs N1 and N2 and outputs MO and /MO, respectively. VC' stands for a power source of a latch circuit.

Figure 21:
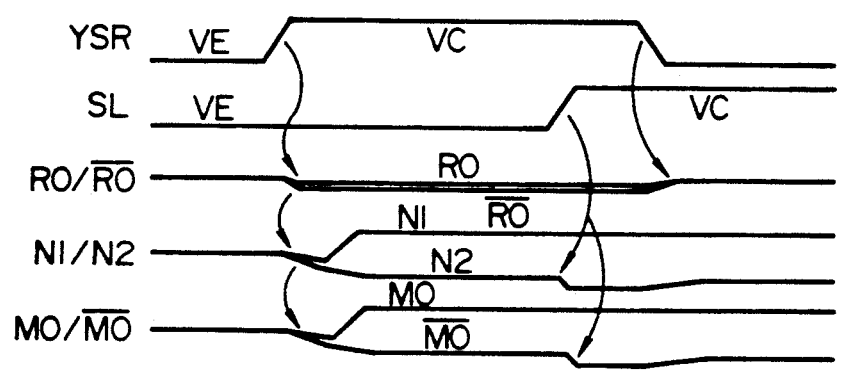
FIG. 21 is a graph useful to explain the operation of the circuit of FIG. 20.

The operation of the circuit of FIG. 20 will be described by reference to the graph of FIG. 21. When the signal YSR is at the low level VE, the MOS elements in the read switch RM are off and hence the inputs N1 and N2 and the outputs MO and/MO are of the identical potential values, respectively.

When the signal YSR is set to the high level VC in this state, the switch RM is turned on to cause a current difference to appear between the terminals RO and /RO as described in conjunction with FIG. 7. Consequently, due to functions of resistors R1 and R2, a voltage difference occurs between resistors R1 and R2, thereby generating a voltage difference between the terminals MO and /MO which is lower than that between the input terminals by the forward-directional voltage VBE.

When the signal SL is set in this state to the high level VC to turn the current source MS on, the voltage discrepancy is kept retained between the output terminals MO and /MO even if the signal YSR is set to the low level VE. As a result, functions necessary for the embodiment of FIG. 7 can be implemented. With regard to the example of FIG. 20 adopting bipolar transistors, the current-to-voltage converter circuit of this type having a latch function may also be constructed only with MOS transistors.

Figure 15:
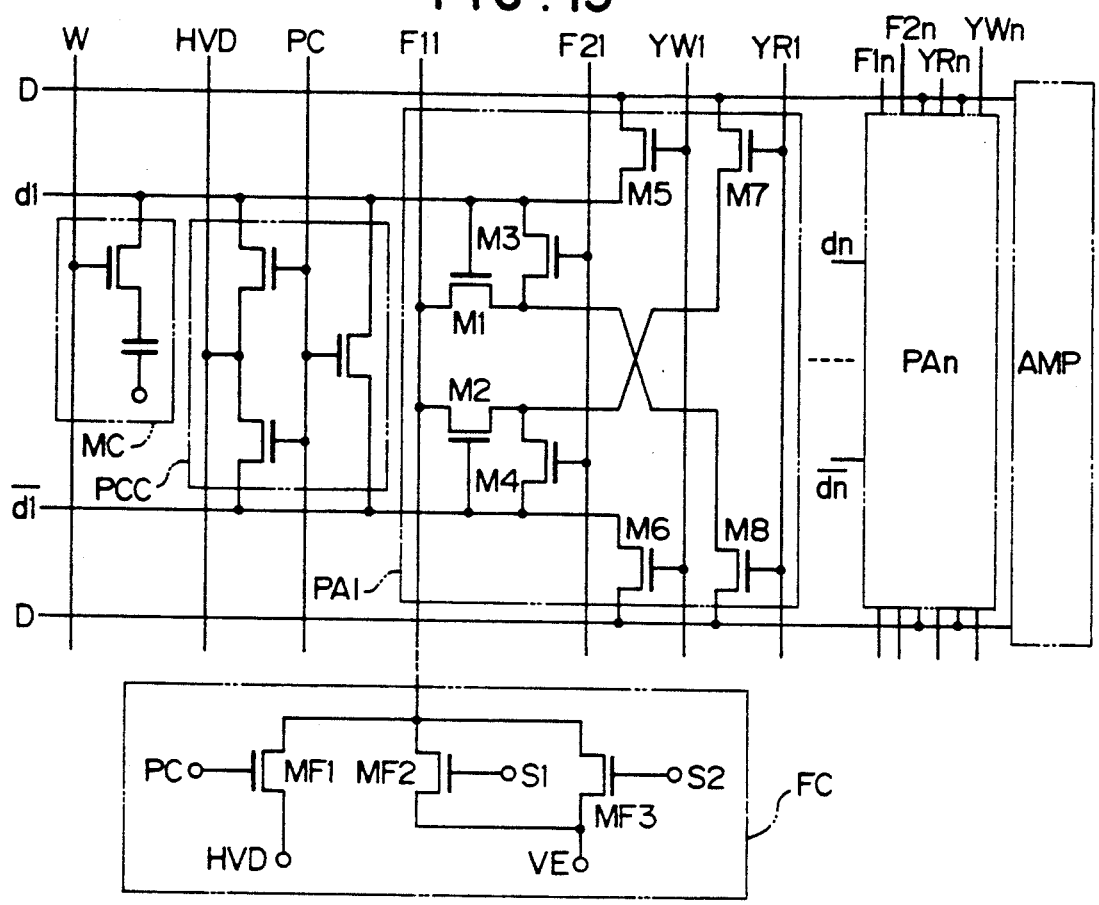
FIG. 15 is a schematic diagram showing a sixth embodiment according to the present invention.

FIG. 15 shows the configuration of the sixth embodiment according to the present invention. This structure is advantageous in that a common source line is applied with a voltage sufficiently lower than a voltage which may possibly be developed between the data lines so as to increase the operation speed of the elements M1 and M2.

The line F11 is controlled in the different manner. Namely, the constitution of FIG. 15 is substantially equal to that of the fourth embodiment of FIG. 9 excepting that the line F11 is supervised by the circuit FC. The same reference numerals and symbols are also used in FIGS. 15 and 9 excepting the reference numeral FC. In the circuit FC, MF1 indicates a MOS transistor controlled by the signal PC to precharge the line F11 to the voltage HVD, MF2 indicates a MOS transistor controlled by the signal S1 to electrically link the line F11 to the voltage VE for threshold voltage compensation, and MF3 indicates a MOS transistor to establish a strong short circuit between the line F11 and the voltage VE. The transistors MF2 and MF3 may be replaced with a transistor developing their functions.

Referring to the graph of FIG. 16, description will be given of the operation of the circuit of FIG. 15.

In the initial state, the signal PC is at the high level VC, the signals S1 and S2 are at the low level VE, and the data line pairs {d1,/d1}, ..., {dn,/dn} and the line F11 are precharged to the initial voltage HVD.

Moreover, since the line F21 is at the high level VC, the MOS transistors M3 and M4 are on. In the MOS M1 and M2, gate and drain regions thereof are electrically connected to each other to form a diode.

Since the signals YR1 and YW1 are at the low level VE, the MOS M5 to M8 are off. The word line W is at the low level VDL and the switching transistor in the memory cell MC is off.

In addition, the data lines D and /D are precharged to the potential HVD2 by a circuit in the amplifier, not shown.

In operation, the signal PC is first set to the low level VE to set the line pairs {d1,/d1} to {dn,/dn} and the line F11 to a floating potential.

When the signal S1 is set to a high level to turn the element MF2 on, the line F11 is set to a lower potential and then the data line pairs d1 and /d1 are discharged via the transistors M1 and M2 thus connected in a form of a diode. Until the elements M1 and M2 are turned on, the potential of the line F11 is rapidly lowered. After the elements are turned on, the potential thereof is slowly decreased in association with the discharge operation from the data line capacitance. In this operation, the lines d1 and /d1 are discharged to potential values respectively higher than the potential of the line F11 by the threshold values of the elements M1 and M2, respectively. In this period of time, the system accomplishes compensation for the variation in the threshold voltage for each of the data line pairs.

When the voltage difference between the paired data lines is set to be substantially equal to the threshold voltage discrepancy between the transistors M1 and M2, the line F21 is set to the low level VE to turn the elements M3 and M4 off, thereby stopping the data line discharge operation. Since the discharge operation is accomplished to an extent only to compensate for the threshold variation, the voltage of each of the data lines is not lowered beyond the initial precharge voltage and is remained at a value exceeding the voltage VDL.

In this situation, the word line W is set to the high level VW to deliver electric charges from the memory cell MC onto the data lines. The signal S2 is then set to the high level VC to cause the element MF3 to lower the potential of the line F11 to the voltage VE. Moreover, the line YR1 is set to a high level to turn the MOS transistors M7 and M8 on, the transistors M7 and M8 being disposed for a write operation. Resultantly, signal currents associated with signal voltages on the lines d1 and /d1 are passed respectively via the elements M1 and M2 to the common data lines D and /D, thereby sensing the currents by the amplifier AMP. An amplified signal is outputted from the amplifier AMP to a circuit in a subsequent stage; furthermore, there appear on the lines D and /D signals having a large amplitude ranging from the high level of VDH and the low level of VDL.

Thereafter, the line YR1 is set to a low level to turn the elements M7 and M8 off and the line YW1 is set to the high level VW to expand the voltage discrepancy between the lines d1 and /d1 up to the voltage difference between the voltages VDH and VDL. Since the word line W is at the high level VW, this operation means that a re-write operation is conducted on the memory cell MC. Similarly, for the circuit in the amplifier AMP, the potential values of the lines D and /D are altered according to the variation in the threshold value between the MOS transistors in the amplifier AMP, thereby increasing the sensitivity thereof. In accordance with the present invention, in addition to the advantage of the fourth embodiment of FIG. 9, there can be obtained an advantageous feature that the line F11 can be easily controlled.

Figures 16, 17A, 17B:
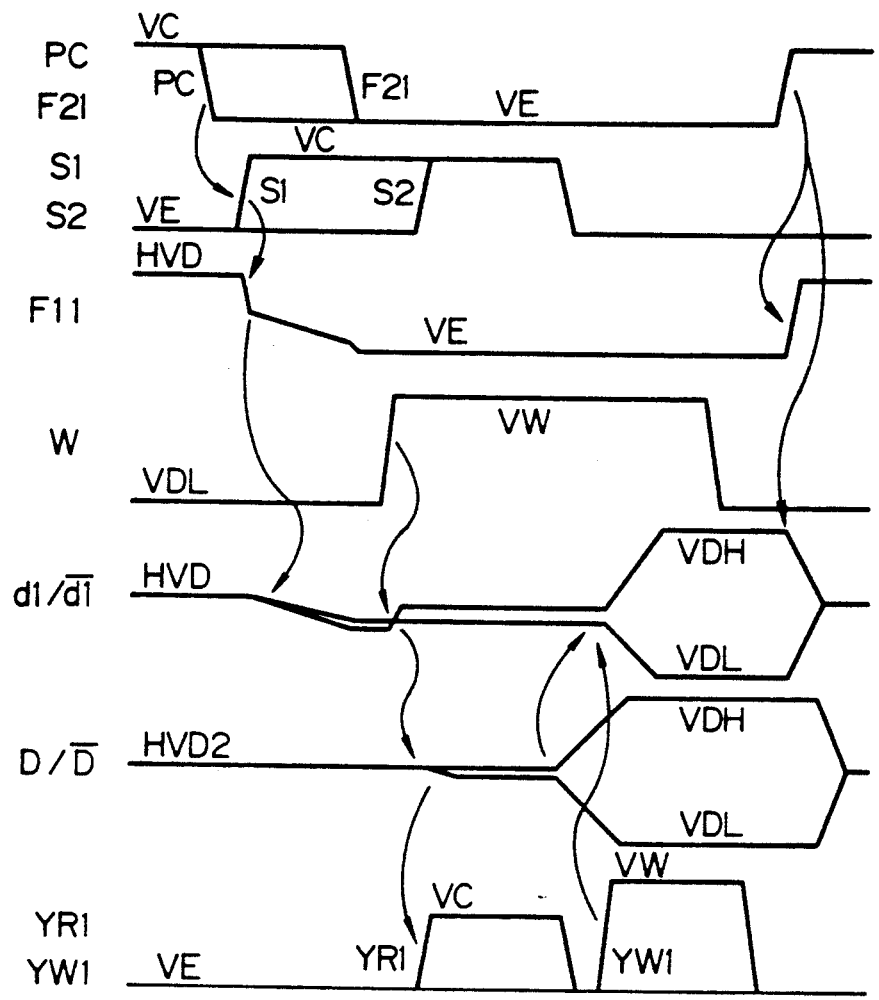
FIG. 16 is a graph for explaining the operation of the sixth embodiment according to the present invention.
FIGS. 17a and 17b are graphs showing relationships of magnitude between various kinds of voltages in an embodiment according to the present invention.

FIGS. 17a and 17b show relationships between external power source voltages and internal power source voltages generated by the on-chip voltage converter circuit in the device according to the present invention. In a FIG. 17a, the high potential of the word line is increased to exceed the external voltage VC. Moreover, the potential of the common source region of the elements M1 and M2 sensing the voltage difference between paired data lines is set to a value sufficiently lower than that of the gate regions thereof. This increases the operation speed of the differential amplifier associated with the elements M1 and M2 as compared with the embodiments shown in the diagrams up to FIG. 14. The high potential VDH of the data lines and/or the high potential VCL of the control circuit may be set to be lower than or equal to the external power source voltage VC. In order to increase the operation speed of the control circuit and to decrease the currents flowing through the data lines, the potential VDH is set to be lower than the potential VCL in many cases. The word line voltage is set to be sufficiently higher than the data line high voltage VDH at least by the threshold voltage of the switching transistor of the memory cell. Moreover, the data line precharge potential HVD is selected to be at an intermediate potential between the potential VDH and the potential VDL. However, according to the present invention, since the data line potential becomes to be lower than the threshold voltage during the compensation for the variation in the threshold voltage between the pertinent transistors, the potential HVD may be set to a higher value in association with the decreased portion of the data line potential. The substrate potential VB is set to be equal to or less than the external power source voltage VE. In FIG. 17b, unlike in FIG. 17a, the word line high potential VW is selected to match the external power source voltage VC and the high potential VCL of the control circuit is set to match the data line high potential VDH. With the provision above, the voltages necessary for the implementation of the present invention can be developed with a minimized number of power sources.

Figure 18:
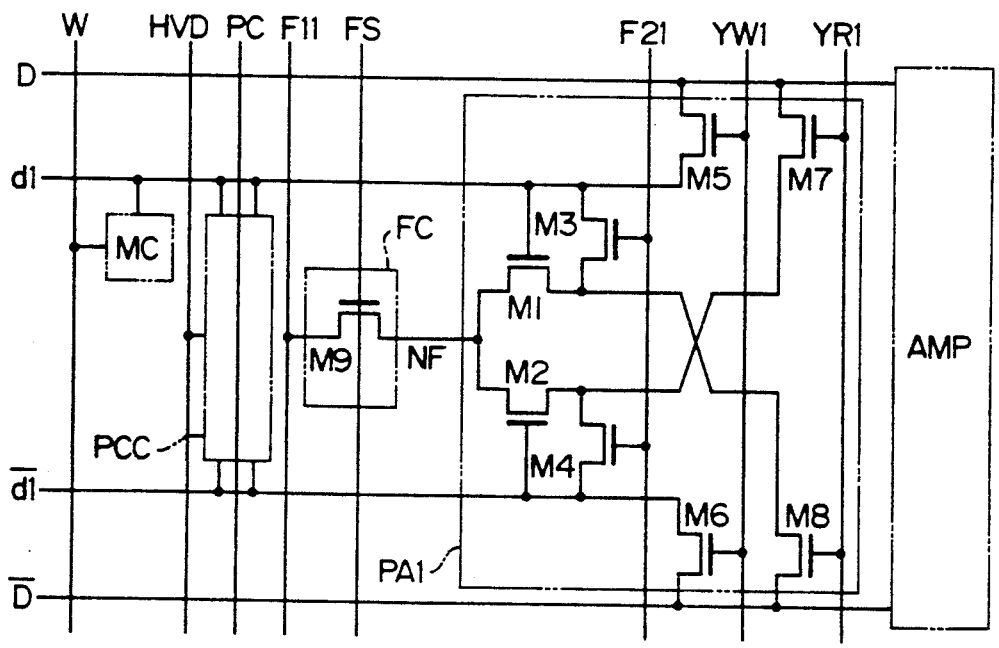
FIG. 18 is a diagram showing a seventh embodiment according to the present invention.

FIG. 18 shows the constitution of the seventh embodiment according to the present invention. This embodiment is different from the sixth embodiment of FIG. 15 as follows. In contrast to FIG. 15 where many control operations of the line F11 are collectively accomplished, a control circuit FC including a MOS element M9 is disposed for each circuit PA1 to control the gate region thereof in FIG. 18, thereby achieving an operation similar to that of the sixth embodiment of FIG. 15. In the embodiment of FIG. 18, the line F11 may be fixed to the low level VE. Namely, the element M9 corresponds to the elements MF2 and MF3 of FIG. 15. First, since the line FS is at the low level and the element M9 is off, when the elements M3 and M4 are turned on, the line NF is precharged to a potential lower than the potential HVD by the lower one of the threshold voltages of the elements M1 and M2. When the line FS is set to a high level to turn the element M9 on, the potential of the line NF is varied in a manner similar to that of the line F11 of FIG. 16, thereby compensating for the variation in the threshold voltage between the elements as shown in the graph of FIG. 16. The present invention accordingly unnecessitates the control operations of the line F11 having a considerable load due to the common use among a great number of circuits PA1s, which leads to an advantage of easy control operations as above.

Figure 19A:
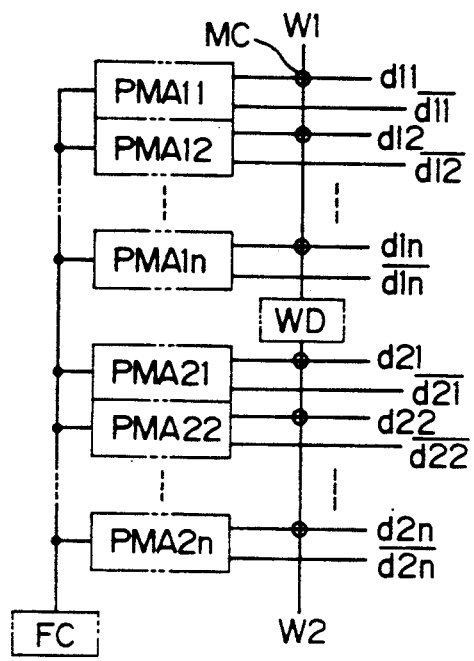
FIGS. 19a, 19b, and 19c are schematic diagrams showing the arrangement of control circuits in an embodiment according to the present invention.
Figure 19B:
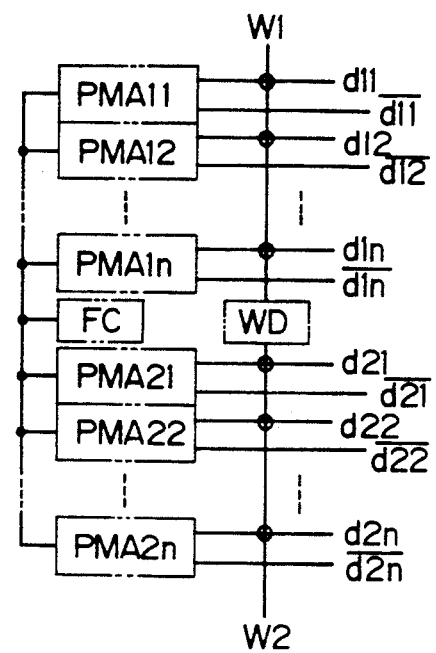
Figure 19C:
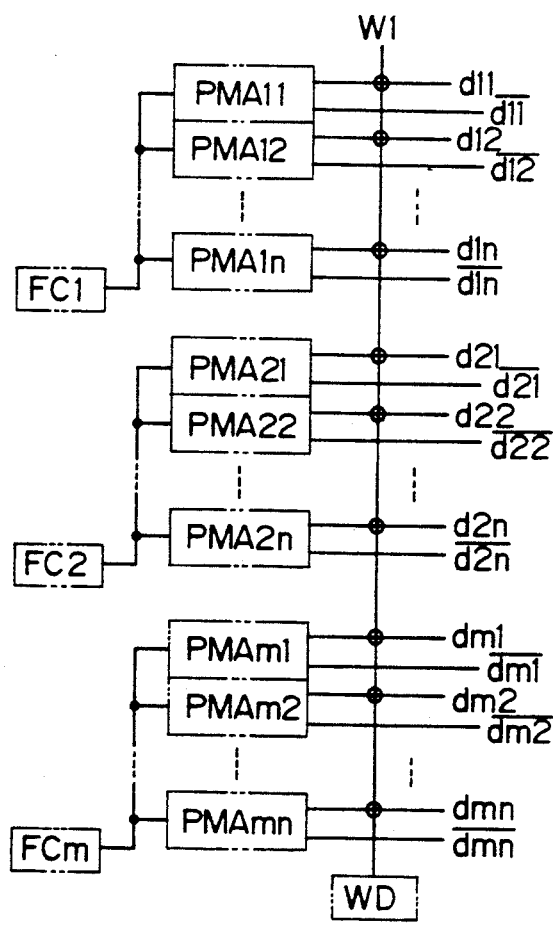

In this regard, although the control circuit FC may be arranged for each of the elements mi and M2, it is also possible to dispose the circuit FC for every several circuits PAs. FIG. 19 shows a method of arranging the control circuit FCs in this manner. In FIG. 19a, all preamplifiers PA11 to PA2n which are related to the word lines W1 and W2 and which achieve operations at the same time (these lines may be collectively handled by disposing a word driver at an end thereof) are controlled by a control circuit FC arranged at an end of the circuit system. In FIG. 19b, the preamplifiers are controlled by the control circuit FC located at a central position of the system. Either one of these configurations is selected according to relationships between restrictions imposed on the element layout and the loads related to the control lines. Moreover, as shown in FIG. 19c, a control circuit FC is arranged for every n preamplifiers PAs. The power source lines may be disposed in parallel with the word lines or may be arranged to be perpendicular thereto, for example, by using a word shunt section.

As DRAM memory cell to which the present invention is applicable, there may be adopted, in addition to an ordinary structure including a combination of a transistor and a capacitor as shown in FIG. 5, a constitution in which DRAM memory cells are connected in series to each other as described, for example, in pages 106 and 107 of the "1991 ISSCC Digest". moreover, there may be used a method in which information exceeding binary value information is stored in a memory cell constituted with a transistor and a capacitor.

Figure 22:
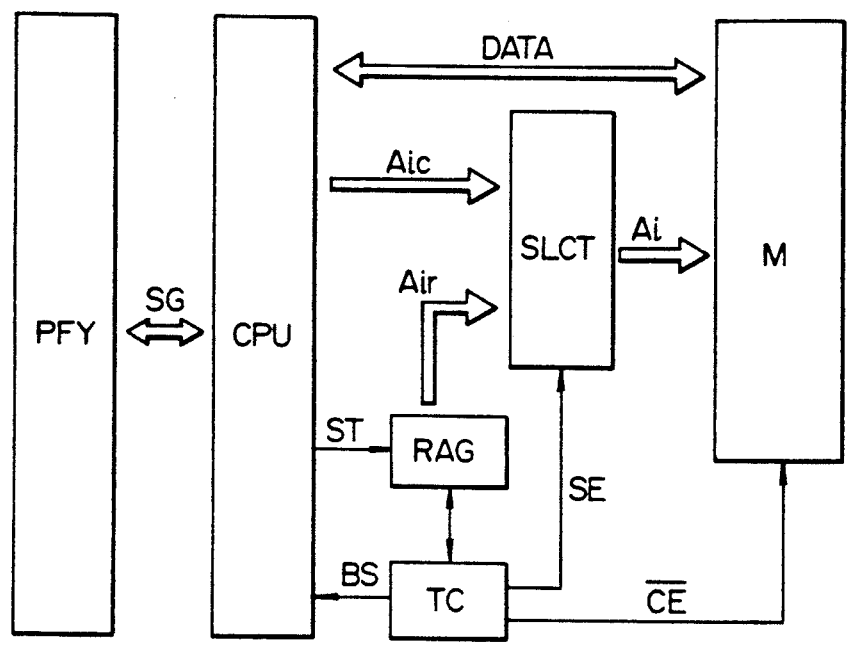
FIG. 22 is a diagram showing the system constitution to which the present invention is applied.

FIG. 22 shows a system configuration employing a semiconductor IC device according to the present invention. Arrow marks indicate signal flows. The system includes a semiconductor IC device implemented as a DRAM in which the sense amplifier circuit of the present invention is used to read a very small signal from a memory cell, a processor CPU for controlling the overall system operation, a refresh address generator RAG, a DRAM control signal generator TC, a selector SLCT for achieving selection between an address sent from the CPU and a refresh address signal delivered from the refresh address generator RAG. Moreover, PFY indicates a unit in the system e.g. an external storage, a display, or an arithmetic logic unit. This unit may be connected via a communication line to another information processor in some cases.

DATA stands for data to be communicated between the CPU and the DRAM device M, Aic indicates a signal produced from the CPU, Air denotes a refresh address signal created from the refresh address generator RAG, and Ai designates an address signal selected by the selector SLCT to be sent to the DRAM device M. ST stands for a status signal delivered from the CPU to the generator RAG and BS indicates a busy signal fed from the generator TC to the CPU. SE denotes a signal sent from the generator TC to initiate the selector SLCT and /CE is a signal used to activate the DRAM to which the present invention is applied. SG designates communications of signals between the CPU and the other units in the system. With provision of the semiconductor device to which the present invention is applied, even when a precise manufacturing dimension is employed to increase the integration degree, the operation speed and high reliability of the resultant product can be kept unchanged.

According to the present invention, in a semiconductor IC device having a sense amplifier amplifying a very small signal, the precharge voltages of the input lines thereof are appropriately changed to compensate for the variation in the characteristics of the respective constituent elements of the semiconductor IC device caused by differences in the impurity concentrations and fabrication dimensions. This resultantly provides a semiconductor device achieving a high-speed amplification irrespective of the variation in the characteristics above.

While particular embodiments of the invention have been shown and described, it will be obvious to those skilled in the art that various changes and modifications may be made without departing from the present invention in its broader aspects.

We claim:

1. A semiconductor IC device having a sense amplifier circuit amplifying a differential input voltage between a voltage of a first input signal line and a voltage of a second input signal line,
   wherein said sense amplifier circuit comprises:
   a first n-type channel MOS transistor and a second n-type channel MOS transistor, gates of which are connected to said first input signal line and said second input signal line so as to achieve a differential operation in response to said differential input voltage;
   a first switch connected between a drain and said gate of said first n-type channel MOS transistor;
   a second switch connected between a drain and said gate of said second n-type channel MOS transistor;
   a third switch connected between said drain of said first n-type channel MOS transistor and said second input signal line; and
   a fourth switch connected between said drain of said second n-type channel MOS transistor and said first input signal line;
   wherein either one of said first and second input signal lines is connected to a memory cell;

wherein said first and second input signal lines are connected to a precharge circuit;

wherein said first and second n-type channel MOS transistors have sources commonly connected to each other;

wherein said first and second input signal lines are connected to a first p-type channel MOS transistor and a second p-type channel MOS transistor, said first and second p-type channel MOS transistor having sources commonly connected to each other;

wherein said first input signal line is connected to a drain of said first p-type channel MOS transistor and a gate of said second p-type channel MOS transistor;

wherein said second input signal line is connected to a drain of said second p-type channel MOS transistor and a gate of said first p-type channel MOS transistor;

wherein during a period of time when said first and second switches are turned on, said third and fourth switches are turned off so that said first and second signal lines are precharged to a predetermined voltage in advance by said precharge circuit;

wherein, thereafter, the precharge operation of said precharge circuit is finished and threshold voltages are generated respectively between the gate and the source of said first and second n-type channel MOS transistors;

wherein, thereafter, said first and second switches are turned off and information from said memory call is applied to said one of said first and second input signal lines, thereby obtaining a differential output corresponding to the information from the drains of said first and second n-type channel MOS transistors; and wherein, thereafter, said third and fourth switches are turned on and the commonly connected sources of said first and second p-type channel MOS transistors are set to a high voltage.

2. A semiconductor IC device having a sense amplifier circuit amplifying a differential input voltage between a voltage of a first input signal line and a voltage of a second input signal line, wherein said sense amplifier circuit comprises:

a first n-type channel MOS transistor and a second n-type channel MOS transistor, gates of which are connected to said first input signal line and said second input signal line so as to achieve a differential operation in response to said differential input voltage;

a first switch connected between a drain and said gate of said first n-type channel MOS transistor;

a second switch connected between a drain and said gate of said second n-type channel MOS transistor;

a third switch connected between said drain of said first n-type channel MOS transistor and said second input signal line; and a fourth switch connected between said drain of said second n-type channel MOS transistor and said first input signal line;

wherein either one of said first and second input signal lines is connected to a memory cell;

wherein said first and second input signal lines is connected to a precharge circuit;

wherein said first and second n-type channel MOS transistors have sources commonly connected to each other;

wherein said first and second input signal lines are connected to a first p-type channel MOS transistor and a second p-type channel MOS transistor, said first and second p-type channel MOS transistors having sources commonly connected to each other;

wherein said drain of said first n-type channel MOS transistor is connected to a drain of said first p-type channel MOS transistor;

wherein said drain of said second n-type channel MOS transistor is connected to a drain of said second p-type channel MOS transistor;

wherein during a period of time when said first and second switches are turned on, said third and fourth switches are turned off so that said first and second signal lines are precharged to a predetermined voltage in advance by said precharge circuit;

wherein, thereafter, the precharge operation of said precharge circuit is finished and threshold voltages are generated respectively between the gate and the source of said first and second n-type channel MOS transistors;

wherein, thereafter, said first and second switches are turned off and information from said memory cell is applied to said one of said first and second input signal lines, thereby obtaining a differential output corresponding to the information from the drains of said first and second n-type channel MOS transistors; and wherein, thereafter, said third and fourth switches are turned on and the commonly connected sources of said first and second p-type channel MOS transistors are set to a high voltage.

3. A semiconductor IC device having a sense amplifier circuit amplifying a differential input voltage between a voltage of a first input signal line and a voltage of a second input signal line, wherein said sense amplifier circuit comprises:

a first n-type channel MOS transistor and a second n-type channel MOS transistor, gates of which are connected to said first input signal line and said second input signal line so as to achieve a differential operation in response to said differential input voltage;

a first switch connected between said gate and one of a drain and a source of said first n-type channel MOS transistor;

a second switch connected between said gate and one of a drain and a source of said second n-type channel MOS transistor;

a third switch connected between another one of said drain and said source of said first n-type channel MOS transistor and said second input signal line;

a fourth switch connected between another one of said drain and said source of said second n-type channel MOS transistor and said first input signal line;

a fifth switch connected between said gate of said first n-type channel MOS transistor and said first input signal line; and a sixth switch connected between said gate of said second n-type channel MOS transistor and said second input signal line;

wherein either one of said first and second input signal lines is connected to a memory cell;

wherein said one of said drain and said source of said first n-type MOS transistor and said one of said drain and said source of said second n-type MOS transistor are commonly connected to each other;

wherein said first and second input signal lines are connected to a first p-type channel MOS transistor and a second p-type channel MOS transistor, said first and second p-type channel MOS transistors having sources commonly connected to each other;

wherein said first input signal line is connected to a drain of said first p-type channel MOS transistor and a gate of said second p-type channel MOS transistor;

wherein said second input signal line is connected to a drain of said second p-type channel MOS transistor and a gate of said first p-type channel MOS transistor;

wherein, during a period of time when said first and second switches as well as said third and fourth switches are turned on and said fifth and sixth switches are turned off, the commonly connected drains or sources of said first and second n-type channel MOS transistors are set to a high voltage, thereby generating threshold voltages respectively between the gate and source of said first and second n-type channel MOS transistors;

wherein, thereafter, said first and second switches as well as said third and fourth switches are turned off and said fifth and sixth switches are turned on and information from said memory cell is applied to said one of said first and second input signal lines, thereby obtaining a differential output corresponding to the information from the drain-source paths of said first and second n-type channel MOS transistors; and wherein, thereafter, said third and fourth switches are turned on and the commonly connected drains or sources of said first and second n-type channel MOS transistors are set to a low voltage, and the commonly connected sources of said first and second p-type channel MOS transistors are set to a high voltage.

4. A semiconductor IC device according to claim 1, wherein said first, second, third and fourth switches are MOS transistors.

5. A semiconductor IC device according to claim 2, wherein said first, second, third and fourth switches are MOS transistors.

6. A semiconductor IC device according to claim 3, wherein said first, second, third, fourth, fifth and sixth switches are MOS transistors.

* * * * *